United States Patent [19]
Van Loan et al.

[11] Patent Number: 5,247,246
[45] Date of Patent: * Sep. 21, 1993

[54] TESTING OF INTEGRATED CIRCUIT DEVICES ON LOADED PRINTED CIRCUIT BOARDS

[75] Inventors: David R. Van Loan, Diamond Bar; Charles J. Johnston, Walnut; Mark A. Swart, Upland, all of Calif.

[73] Assignee: Everett Charles Technologies, Inc., Pomona, Calif.

[*] Notice: The portion of the term of this patent subsequent to Sep. 17, 2008 has been disclaimed.

[21] Appl. No.: 698,724

[22] Filed: May 10, 1991

Related U.S. Application Data

[60] Division of Ser. No. 427,932, Oct. 25, 1989, Pat. No. 5,049,813, which is a continuation of Ser. No. 214,365, Jul. 1, 1988, abandoned, which is a continuation-in-part of Ser. No. 142,990, Jan. 12, 1988, abandoned, which is a continuation-in-part of Ser. No. 91,536, Aug. 31, 1987, abandoned, which is a continuation-in-part of Ser. No. 39,876, Apr. 17, 1987, abandoned.

[51] Int. Cl.$^5$ .......................................... G01R 31/00
[52] U.S. Cl. ........................... 324/158 F; 324/158 P; 324/158 R
[58] Field of Search ............ 324/158 F, 158 P, 72.5, 324/158 R, 500, 537; 439/65-68, 55, 69, 70, 71

[56] References Cited

U.S. PATENT DOCUMENTS 4,671,590 6/1987 Ignasiak .......................... 439/68
4,749,362 6/1988 Hoffman et al. ............... 324/158 P Primary Examiner—Vinh Nguyen
Attorney, Agent, or Firm—Christie, Parker & Hale

[57] ABSTRACT

Integrated circuit (IC) packages mounted on a loaded printed circuit board (PCB) are tested by a translator module by first placing a corresponding module over each package. Each module has rows of spring contacts for releasably contacting corresponding electrical leads adjacent opposite sides of the IC package. An upper surface of the module has an array of electrically conductive test pads internally connected to corresponding contacts on the module. The test pads match an array of spring probes in the test unit. The module can be a molded plastic housing with metal leaf spring contacts, or it includes a composite flex-circuit material with individual contacts including flexible spring-like metalized plastic fingers. Contacts on the test module can releasably engage the leads on the IC package directly, or they contact separate conductive leads on the PCB adjacent the leads on the IC package. During testing, the spring probes contact the test pads on the test modules and circuit continuity is established via the electrical connections from the spring probes through the modules to the leads adjacent the IC packages. The modules translate dense in-line spacing of leads adjacent the IC packages to the oversized in-line spacing of test pads on the module. The translator module is attached to a flex-circuit cable coupled to the test system electronics. The translator module is manually placed over each IC package during testing.

18 Claims, 19 Drawing Sheets

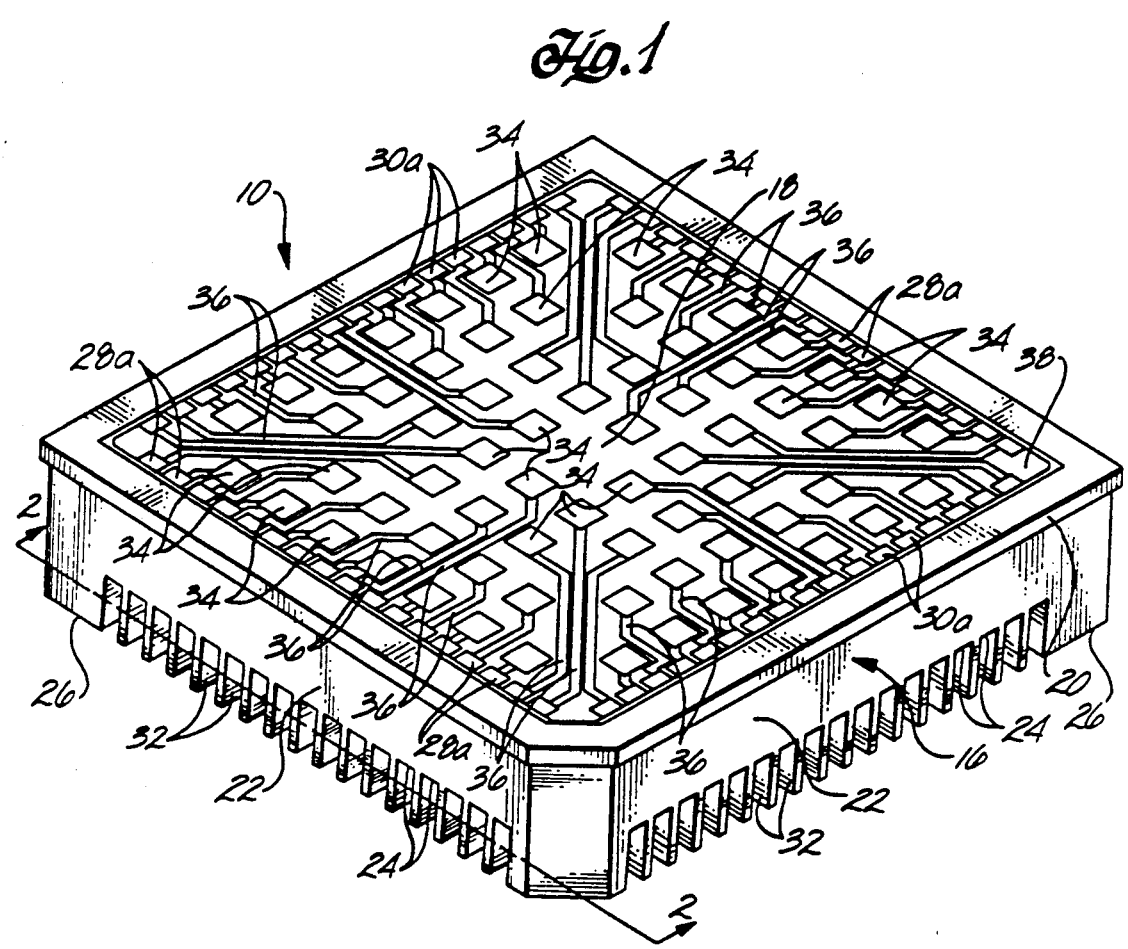

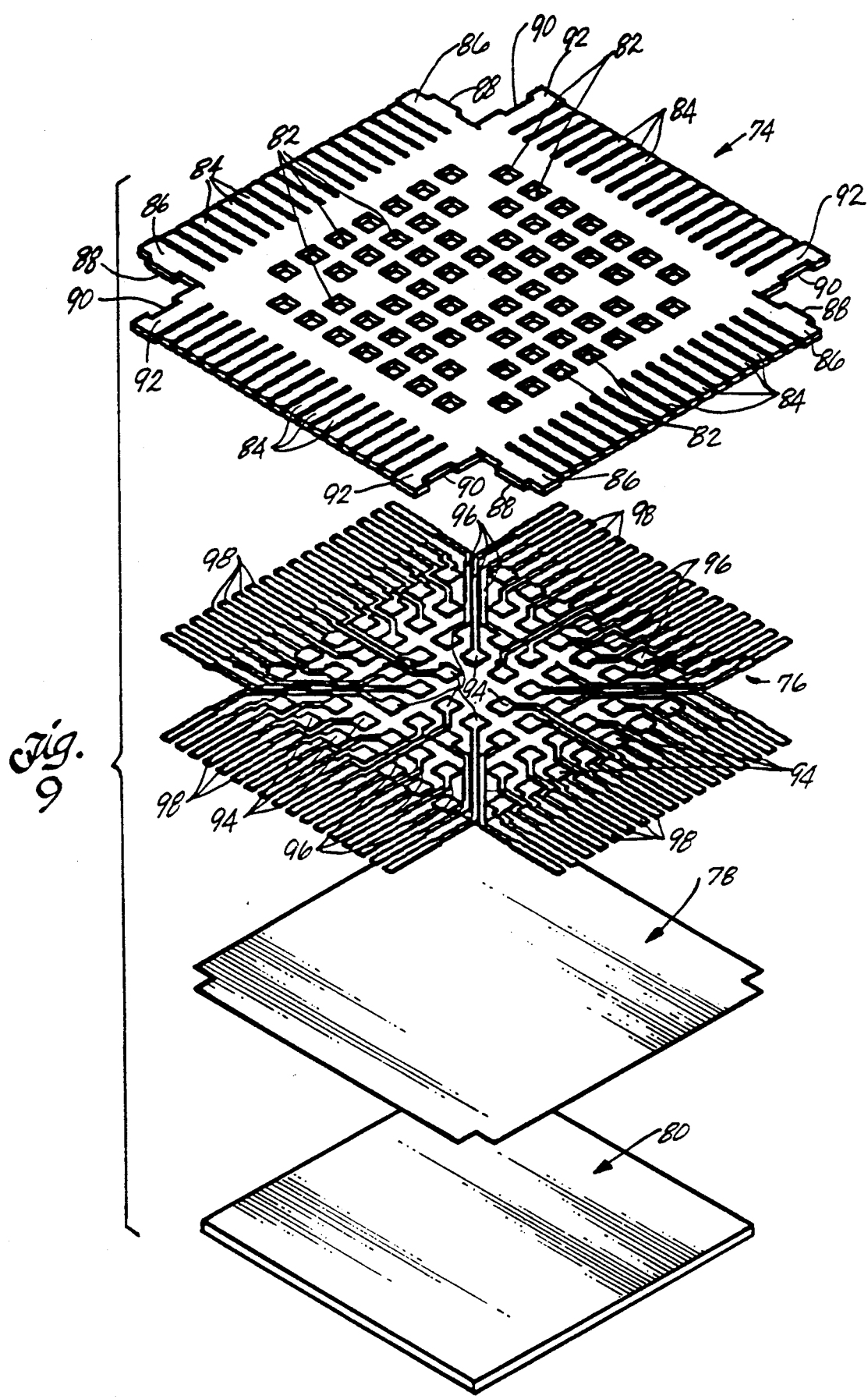

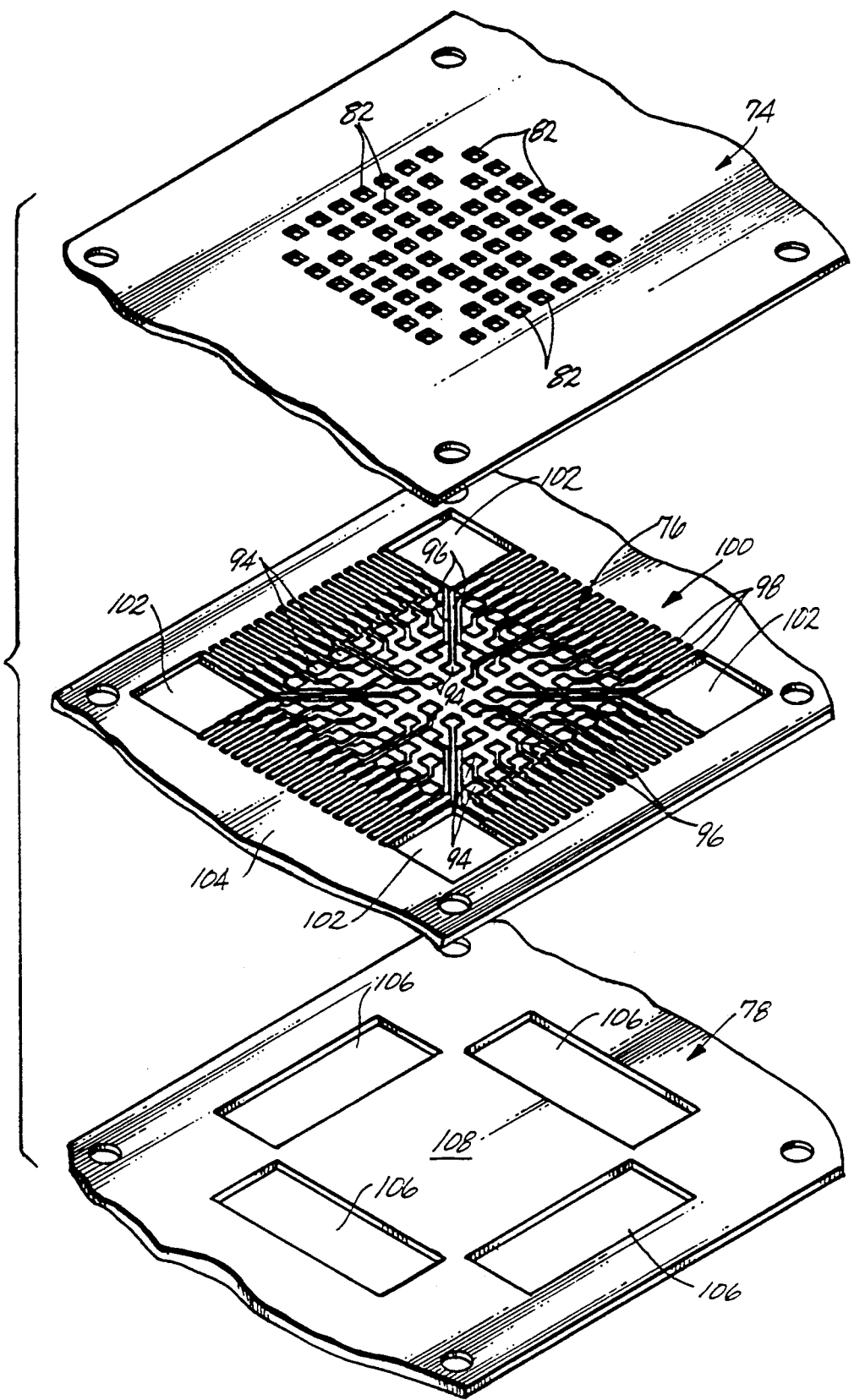

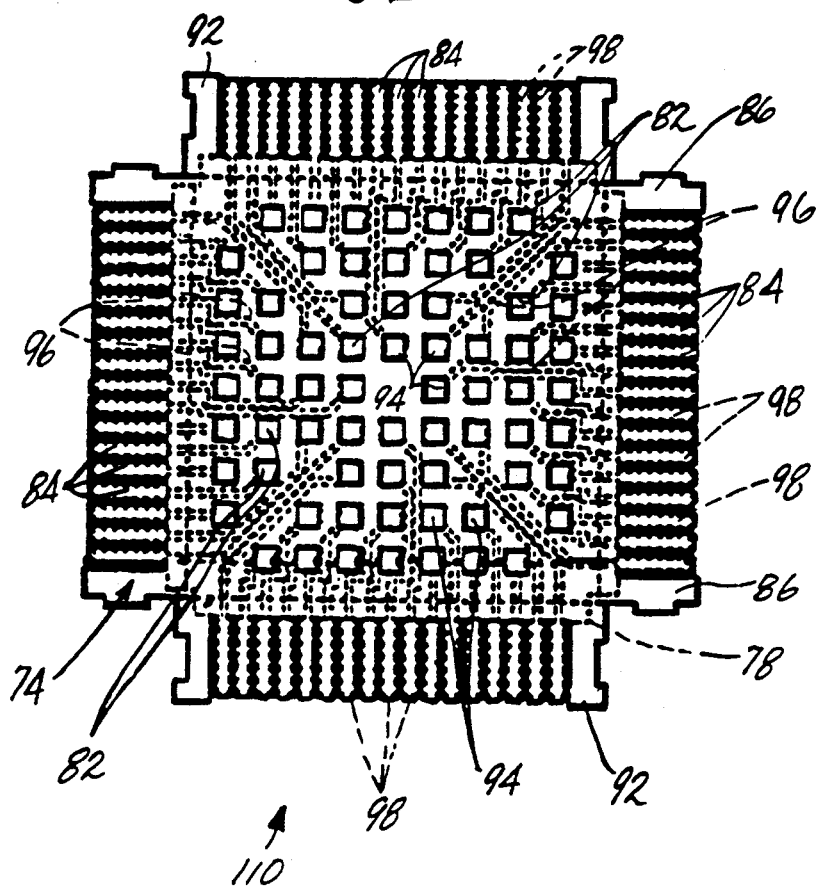

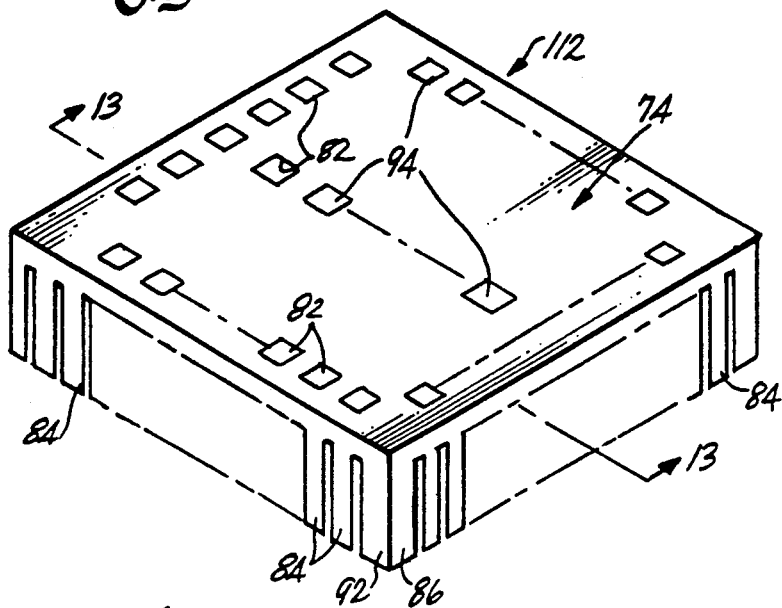
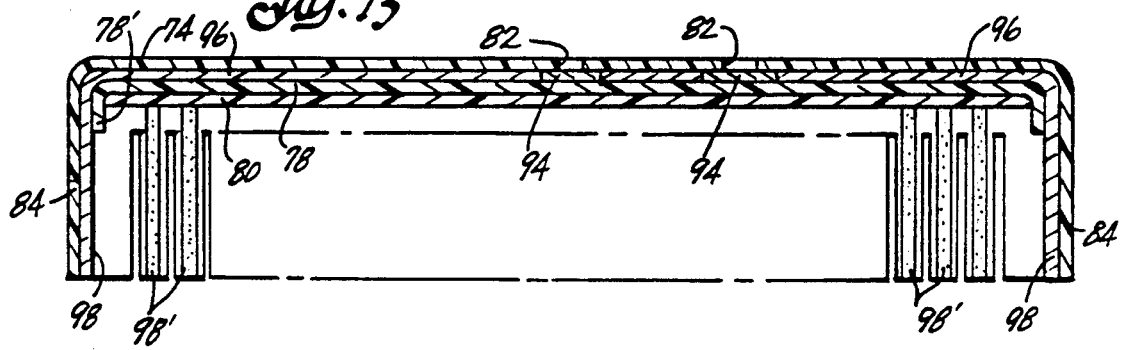
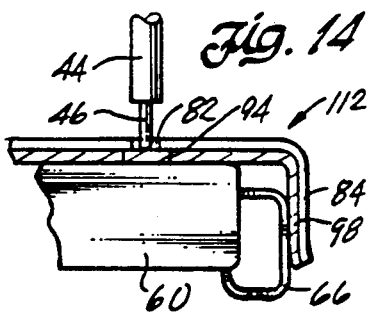 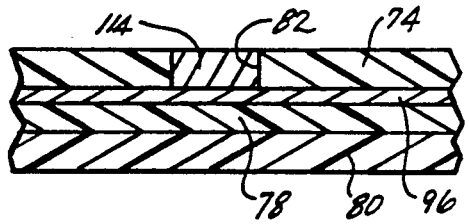
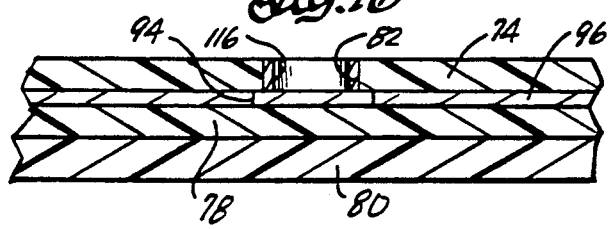

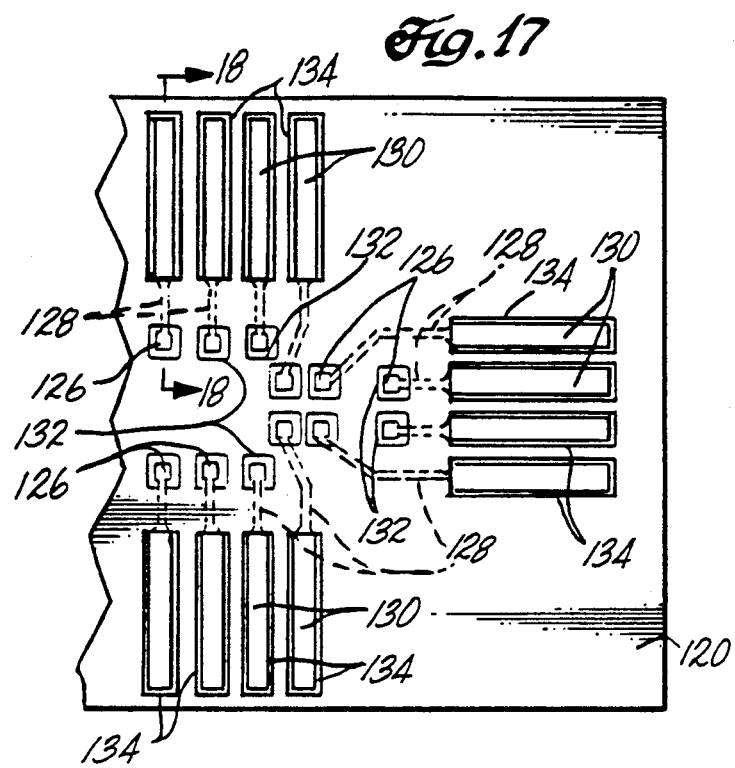
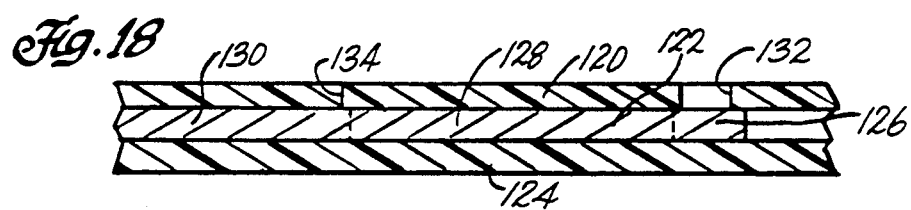
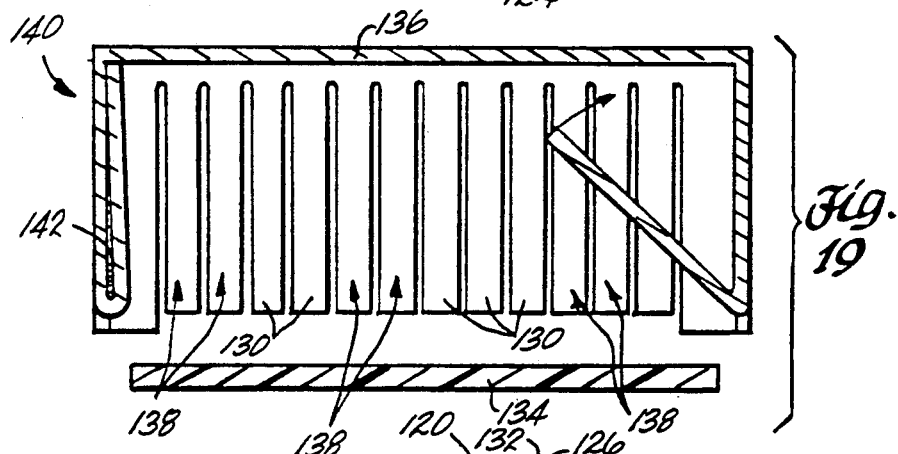
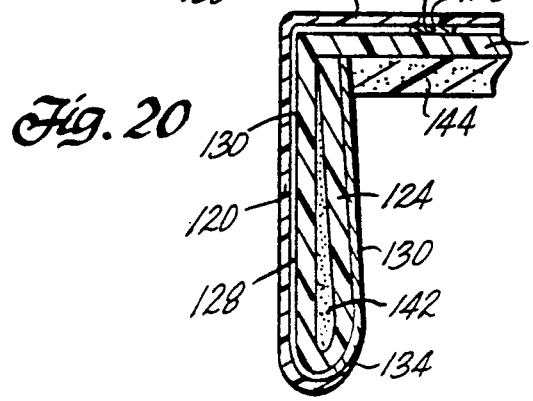

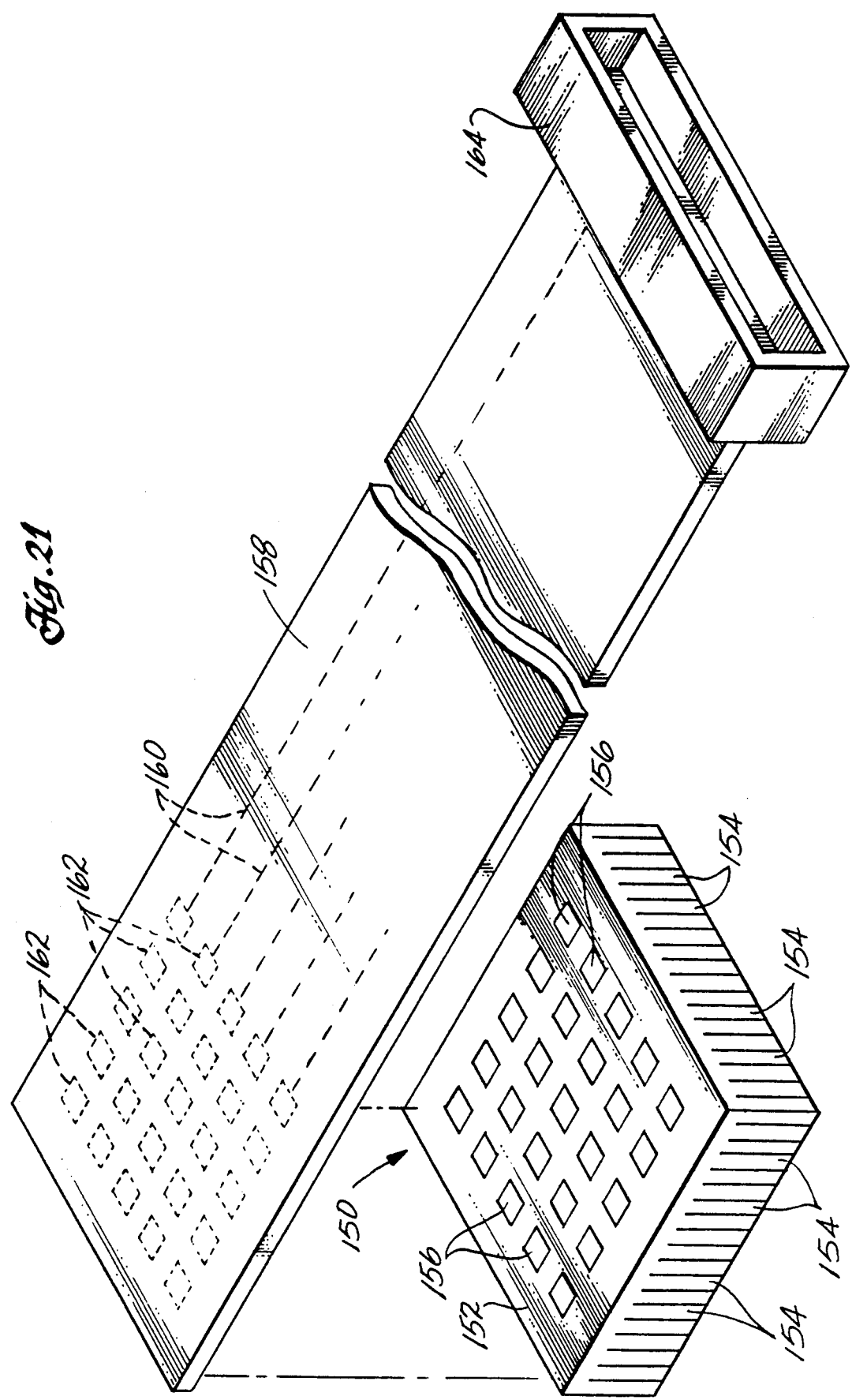

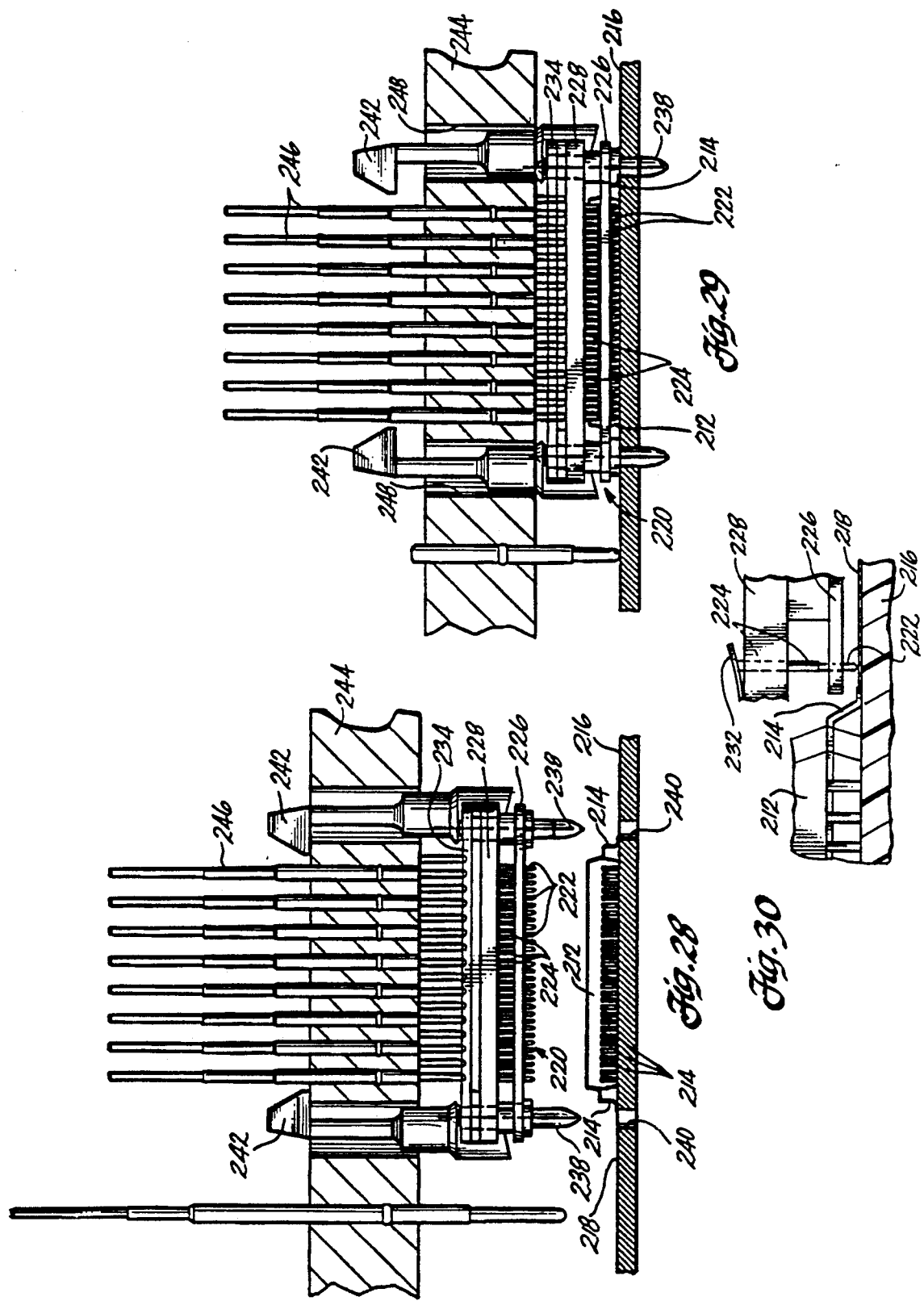

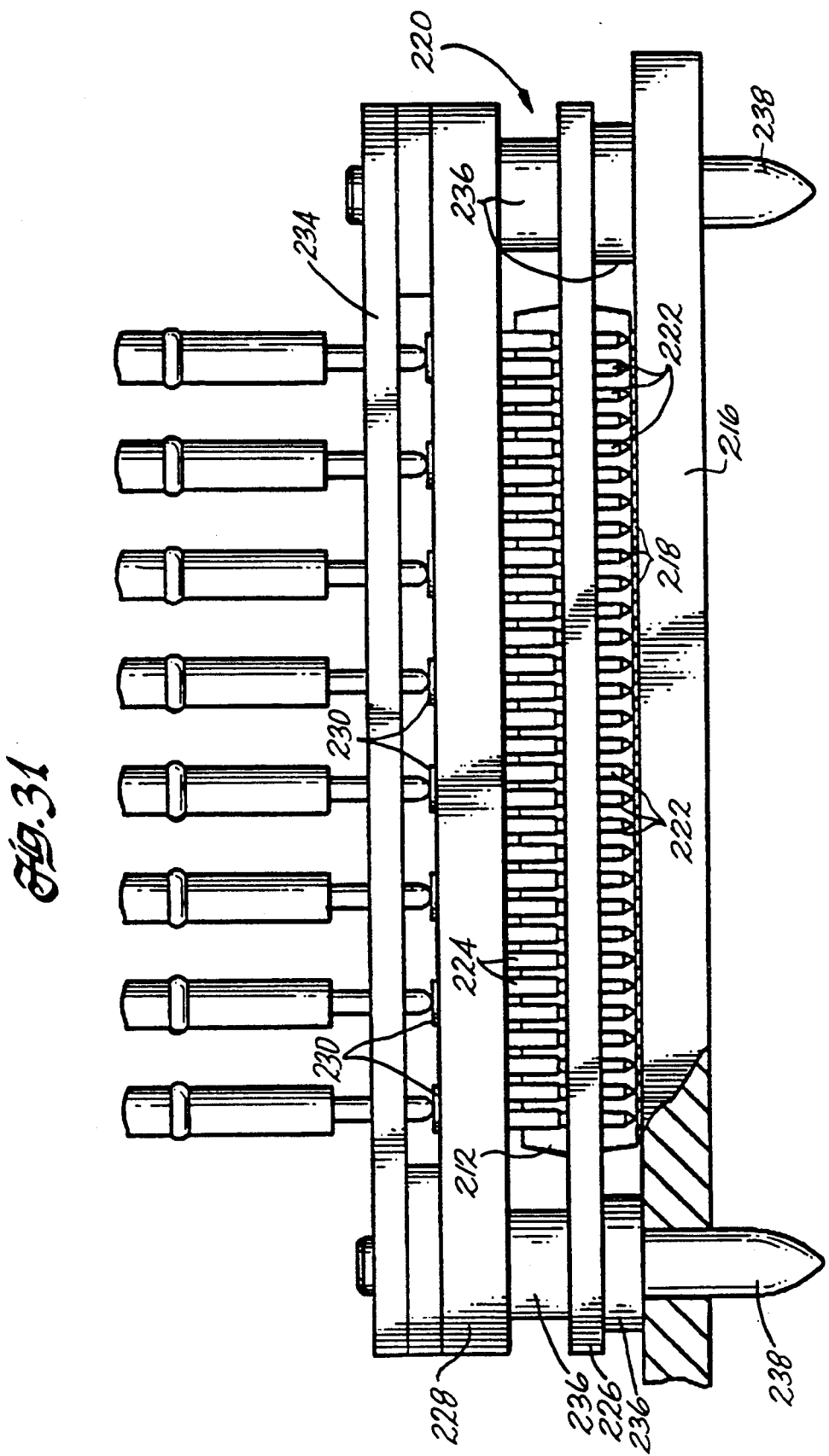

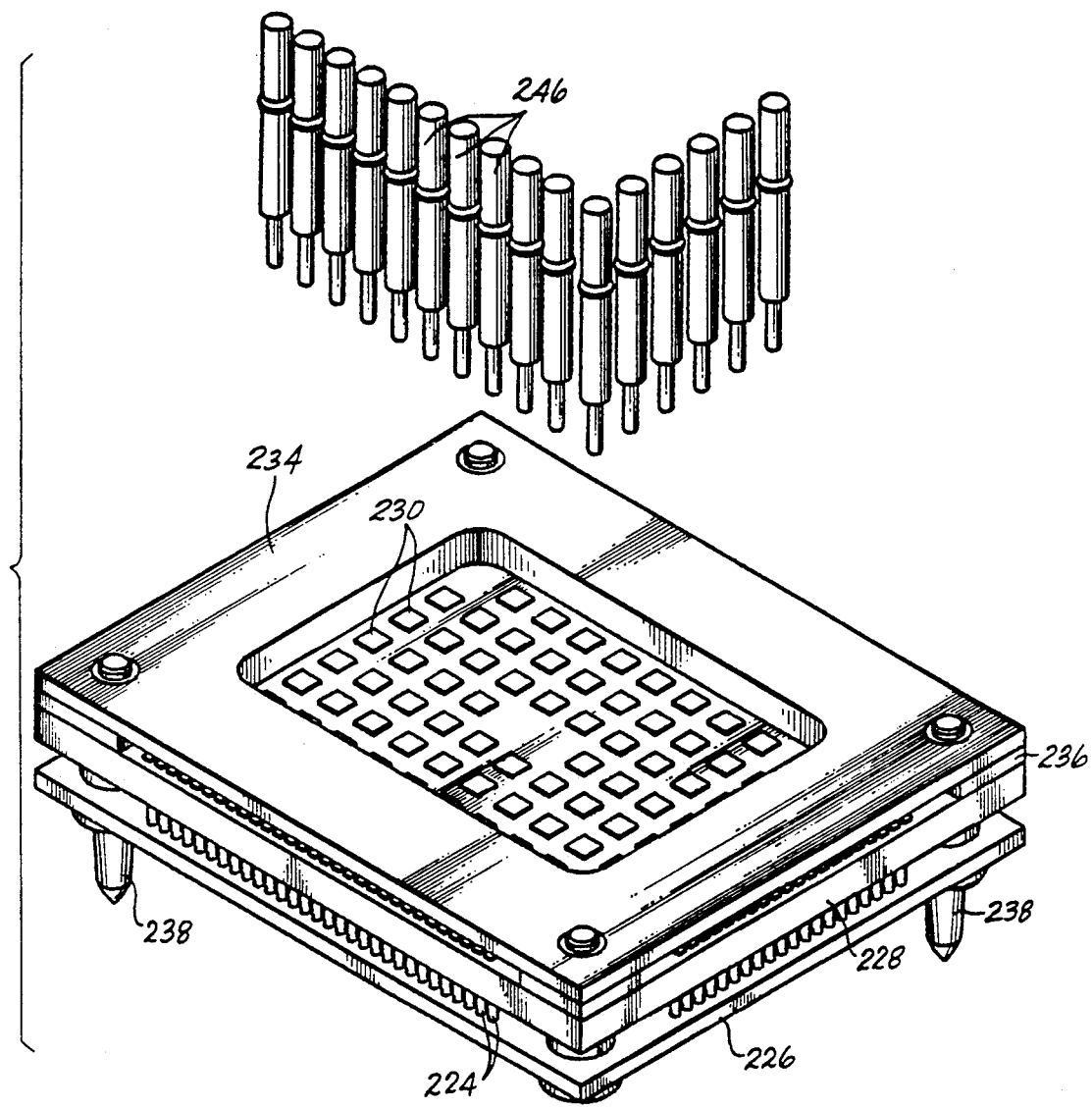

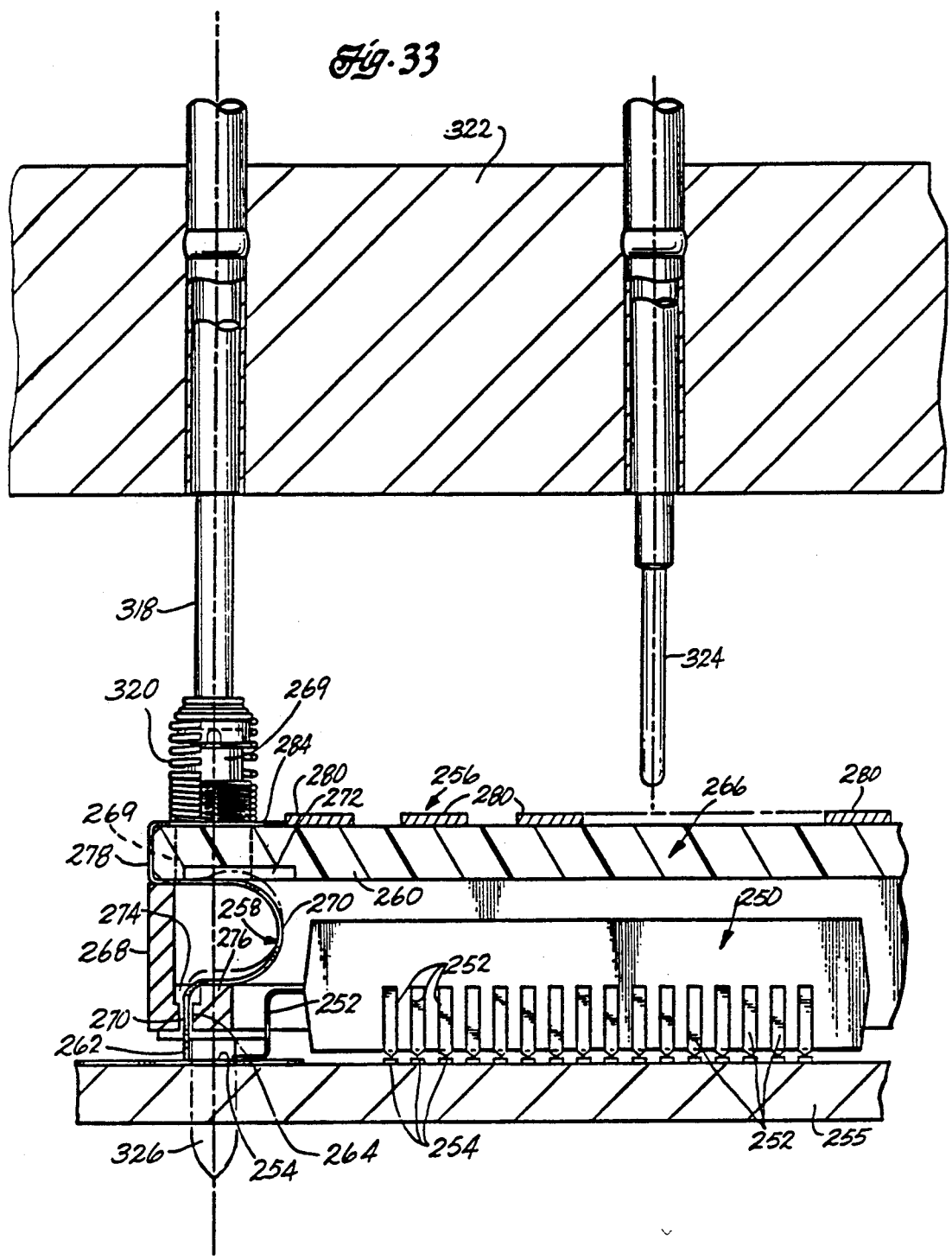

TESTING OF INTEGRATED CIRCUIT DEVICES ON LOADED PRINTED CIRCUIT BOARDS

CROSS REFERENCE

This is a division of Ser. No. 427,932, filed Oct. 25, 1989, now U.S. Pat. No. 5,049,813, issued Sep. 17, 1991, which is a continuation of Ser. No. 214,365, filed Jul. 1, 1988, abandoned, which is a continuation-in-part of Ser. No. 142,990, filed Jan. 12, 1988, abandoned, which is a continuation-in-part of Ser. No. 91,536, filed Aug. 31, 1987, abandoned, which is a continuation-in-part of Ser. No. 39,876, filed Apr. 17, 1987, abandoned.

FIELD OF THE INVENTION

This invention relates to the testing of circuit elements mounted on printed circuit boards, and more particularly, to the testing of integrated circuit packages such as plastic leaded chip-carrier (PLCC) packages mounted on loaded printed circuit boards.

BACKGROUND OF THE INVENTION

Circuit board test systems are used to test large numbers of printed circuit boards by verifying electrical functionality and continuity between various test points on the circuit board. Continuity and lack of continuity are generally detected through the use of test fixtures having an array of test probes for making electrical contact with individual test points on the printed circuit board. Test systems vary in their approach to bringing the array of test probes into contact with test points on the circuit board. One test system for testing loaded circuit boards includes spring biased test probes mounted on a probe plate, and a bellows or vacuum-actuated means of applying pressure between the spring probes and the circuit board test points. The test system also includes a test analyzer which generally includes a computer-controlled detection system for applying selected electrical signals to selected contacts to sense continuity and provide test results. An example of a prior art test system is described in U.S. Pat. No. 4,138,186 to Long, et al.

Loaded printed circuit boards are usually crowded with various electrical components, including arrays of integrated circuit packages. These packages typically include integrated circuits packaged in an insulated housing with a plurality of thin, parallel electrical leads extending from the housing. The leads from the integrated circuit package can be bent into various configurations which makes testing of the packages difficult. For instance, integrated circuit packages with J-lead or gull-wing lead configurations are common. It is common to mount large numbers of these integrated circuit packages close to one another on the circuit board to save board space. If a number of integrated circuit packages are crowded together on a loaded circuit board, there is usually little room left around the integrated circuit packages for making electrical contact between spring probes on a test unit and the leads on the circuit packages or other circuit elements adjacent to the packages.

Semiconductor chips are often produced in dual in-line packages having two sets of spaced apart leads extending along opposite sides of the package. In testing dual in-line packages, the package is commonly plugged into a test head so that the leads on the integrated circuit package engage the test head contacts to perform a series of tests, after which the circuit package is removed from the test head. Test heads for such integrated circuit packages are described in U.S. Pat. Nos. 3,701,077 to Kelly, Jr., and 3,573,617 to Randolph, et al. In most instances, these test heads are used for testing dual in-line packages before they are mounted on printed circuit boards. It is difficult to test dual in-line packages and other integrated circuit packages after they are mounted on a loaded circuit board, especially when the packages are crowded together on the board. Loaded circuit boards are normally tested with the test units described above, in which the spring probes are arranged to make electrical contact with the various test points on the board. In order for the test unit to make electrical contact with rows of leads on integrated circuit packages, it has been proposed to mount integrated circuit test heads, or test sockets, on the probe plate of the test fixture. When the probe plate and printed circuit board are drawn together in the test unit, the test socket passes around the perimeter of the integrated circuit package for making electrical contact with the leads on the package. However, several problems arise from this arrangement:

(a) If the packages are not accurately aligned with the test sockets, the test sockets may not fit around the integrated circuit package.

(b) It is necessary to make special cut-outs in the probe plate for mounting the test sockets.

(c) With the cut-outs in the probe plate, it is difficult to mount spring probes closely adjacent to the cut-out for contacting components closely adjacent to the integrated circuit packages.

(d) Relatively high pressure is required to force the test socket contacts into electrical contact with the leads on the integrated circuit package.

In addition to dual in-line packages, many integrated circuit packages are now available using surface-mount packaging technology which packs electronic functions more densely on circuit boards. This dense packing enables manufacturers to produce smaller boards at lower cost or to provide more functions at the same cost when compared with dual in-line packaging techniques. One common form of surface-mount packaging is the so-called plastic leaded chip-carrier (PLCC) package. Generally speaking, PLCC packages house memory and microprocessor integrated circuit chips requiring large numbers of leads spaced apart along all four sides or at least two opposite sides of a square shaped housing. Because of their small size and large number of leads, it is difficult to test multiple arrays of closely spaced apart PLCC devices mounted on loaded printed circuit boards. The configuration of the leads also makes it difficult to test PLCC devices. In some integrated circuit packages, the lead configuration prevents any contact being made between the leads and the test probes of a test unit. For instance, in packages with leads in a gull-wing configuration, the solder joints are sensitive to external pressures and therefore contact with test probes should be avoided to prevent fracturing the solder joints.

Thus, there is a need to provide a means for testing loaded printed circuit boards having large numbers of integrated circuit packages mounted close to one another on the board. The need for such a test system is especially critical because of the expanding use of surface-mount packages such as PLCC devices which are particularly difficult to test. PLCC devices in particular can be difficult to test with a conventional test head because the PLCC packages can easily become skewed from a square position relative to the circuit board, or because of the need to avoid pressure contact between the leads and the test unit. There is also a need for a test system that does not cause undue delays during testing and is adaptable readily to testing circuit boards having multiple integrated circuit packages mounted in various patterns on different boards.

SUMMARY OF THE INVENTION

Briefly, one embodiment of this invention comprises a translator module that can mounted over an integrated circuit package located on a loaded printed circuit board. The translator module makes contact with rows of spaced apart leads adjacent the integrated circuit package. The module can facilitate circuit verification by a test unit having an array of test probes for use in contacting individual test points on the board. The translator module includes a housing adapted to fit over the integrated circuit package, together with first and second rows of spaced apart electrical contacts arranged along side walls of the housing for making contact with corresponding rows of leads adjacent the circuit package. In one embodiment, a plurality of spaced apart electrically conductive test pads are disposed in a substantially common plane on a top side of the module housing. These test pads are arranged in a pattern for making contact with individual test probes of a circuit continuity test analyzer. The test pads on the module housing are electrically connected internally to corresponding contacts in the first and second rows of module contacts, so that electrical contact between the leads associated with the circuit package and corresponding contacts on the module is translated to individual test probes in the test unit for use in verifying electrical connections between the circuit package and circuit elements on the printed circuit board.

In one form of the invention, the rows of spaced apart contacts on the test module housing are arranged for independent releasable spring biased contact with corresponding leads on the integrated circuit package. In another embodiment, where contact with the leads of the integrated circuit package should be avoided, the test module housing carries separate movable contacts arranged for pressure contact with corresponding electrical leads (conductors or pads) on a printed circuit board to which the leads of the integrated circuit package are individually connected. In this embodiment, means are provided for ensuring good pressure contact between individual contacts on the test module housing and the individual conductors on the printed circuit board.

The translator module can be easily mounted over the integrated circuit package prior to testing. In one embodiment, a plurality of translator modules are mounted over separate integrated circuit packages that can be located in any of various patterns on a loaded printed circuit board. Even if the circuit packages are crowded together, the rows of contacts are arranged on the modules so that reliable contact is made simultaneously with the leads adjacent the closely spaced circuit packages. The pattern of test pads on the top of each module housing matches a predetermined pattern of test probes in the test unit. The printed circuit board with the translator modules in place is inserted into the test unit. As the test probes are drawn toward the printed circuit board, preselected test probes make electrical contact with corresponding test pads on the tops of the translator modules. Other test probes in the test unit are available to make contact with other electrical components, circuit elements, or conductors on the circuit board adjacent the translator modules. Since the pattern of test pads on each module can be arranged to match the pattern of test probes in the test unit, all electrical contact points on the printed circuit board, including all test points in the integrated circuit packages, can be quickly tested for continuity. A densely packed arrangement of leads on the circuit packages can be translated into a less densely packed arrangement of contact points on the top faces of the modules. This facilitates ease of contact with the spring probes of the test unit and accommodates tolerances within a reasonable range so that reliable testing can be done rapidly.

In one embodiment of the invention, the translator module comprises a molded plastic housing with metal leaf spring contacts facing downwardly along the edges of the housing. In another embodiment, the module is made from a "flex-circuit" material so that the contacts each comprise a thin metal film on a flexible plastic backing sheet in which the contacts have a memory for producing rows of spring-like contact fingers along the side edges of the module. The latter embodiment has space-saving advantages on densely packed loaded circuit board and reduced manufacturing costs.

In another form of the invention, the translator module is connected to the end of a flexible cable adapted to conduct test signals to a circuit verification test unit. The housing has separate rows of contacts for releasably contacting corresponding leads on or adjacent an integrated circuit package under test. Conductive leads on the cable are electrically connected to corresponding contacts on the housing. The housing and cable can be made from a flex-circuit material, and in one form of the invention, the module housing and contacts, at least in part, are formed integrally with the flex-circuit cable. In use, the module can be placed manually over each integrated circuit package under test. Test signals are conducted from the housing via the flex-circuit cable to the test analyzer for circuit verification testing. The flex cable, in some instances, can replace the test pads and the test probes which contact the text pads during testing.

One embodiment of the present invention provides a translator module particularly adapted for pressure contact with electrical leads (conductors or circuit traces) on the printed circuit board to which the leads on the integrated circuit package are directly connected. This embodiment avoids direct contact with the leads of the integrated circuit device where such contact is undesirable. This test module also occupies a minimum envelope of space around the integrated circuit package under test so that multiple integrated circuit packages crowded onto a loaded printed circuit board can be tested simultaneously with identical test modules. The spring contacts on the test module preferably comprise spring biased C-shaped beams with vertically extending end portions, the tips of which make vertical contact with the leads on the board. The C-shaped portions of the beams deflect upwardly internally into the test module housing above the respective points of pressure contact. Means are provided to uniformly pre-load the springs to a uniform height and load.

In another embodiment of the invention, a test unit is integrated into an integrated circuit chip carrier or package. An array of test pads are disposed on the exterior of an integrated circuit housing, and these test pads are separately connected internally to corresponding leads from the integrated circuit package. During testing, use of a separate translator module is avoided, and test probes from a test unit contact corresponding test pads on the exterior of the integrated circuit package for testing electrical continuity. This arrangement can be used to test loaded printed circuit boards, in which case continuity can be tested between the individual test probes and the connection of the leads from the package to the individual conductors on the printed circuit board.

These and other aspects of the invention will be more fully understood by referring to the following detailed description and the accompanying drawings.

BRIEF DESCRIPTION OF THE DRAWINGS

FIG. 1 is a perspective view illustrating a translator module according to the principles of this invention.

FIG. 9 is an exploded perspective view illustrating an alternative embodiment of the translator module, in which the module is made from a "flex-circuit" material.

FIG. 10 is an exploded perspective view illustrating one step in a method for making the module of FIG. 9.

FIG. 11 is a top plan view illustrating the assembled module of FIG. 9 after a stamping step and before the module is folded and set in its final configuration.

FIG. 12 is a semi-schematic perspective view illustrating the completed test module.

FIG 13 is a cross-sectional view taken on line 13—13 of FIG. 12.

FIG. 14 is a fragmentary semi-schematic view illustrating use of the alternative test module.

FIG. 15 is a fragmentary schematic cross-sectional view illustrating an alternative construction of the test module of FIGS. 9-13.

FIG. 16 is a schematic cross-sectional view illustrating a further alternative construction of the test module.

FIG. 17 is a fragmentary semi-schematic top view illustrating an alternative embodiment of a translator module made from a composite flex-circuit material.

FIG. 18 is a fragmentary schematic cross-sectional view taken on line 18—18 of FIG. 17.

FIG. 19 is a semi-schematic, partly cross-sectional view illustrating a means for assembling a translator module made from the composite flex-circuit material of FIGS. 17 and 18.

FIG. 20 is a fragmentary schematic cross-sectional view illustrating a portion of the completed module of FIG. 19.

FIG. 21 is a fragmentary exploded perspective view illustrating one embodiment of a translator module secured to a flex-circuit cable adapted for connection to a circuit continuity test unit.

FIG. 28 is a fragmentary semi-schematic side elevation view, partly in cross-section, illustrating use of an alternative test module of this invention for testing leads on an integrated circuit device mounted to a printed circuit board in which direct contact between the module and the contacts is avoided.

FIG. 29 is a fragmentary semi-schematic side elevation view, partly in cross-section, showing the test module of FIG. 28 in use.

FIG. 30 is an enlarged semi-schematic cross-sectional view showing use of the test module of FIGS. 28 and 29.

FIG. 31 is a fragmentary semi-schematic side elevation view, partly in cross-section, illustrating a test unit similar to the test module shown in FIGS. 28 through 30.

FIG. 32 is a semi-schematic perspective view illustrating use of the test module shown in FIG. 31.

FIG. 33 is a fragmentary, semi-schematic cross-sectional view illustrating an alternative embodiment of the invention in which the contacts on the test module comprise C-shaped beams.

DETAILED DESCRIPTION

Figure 4:
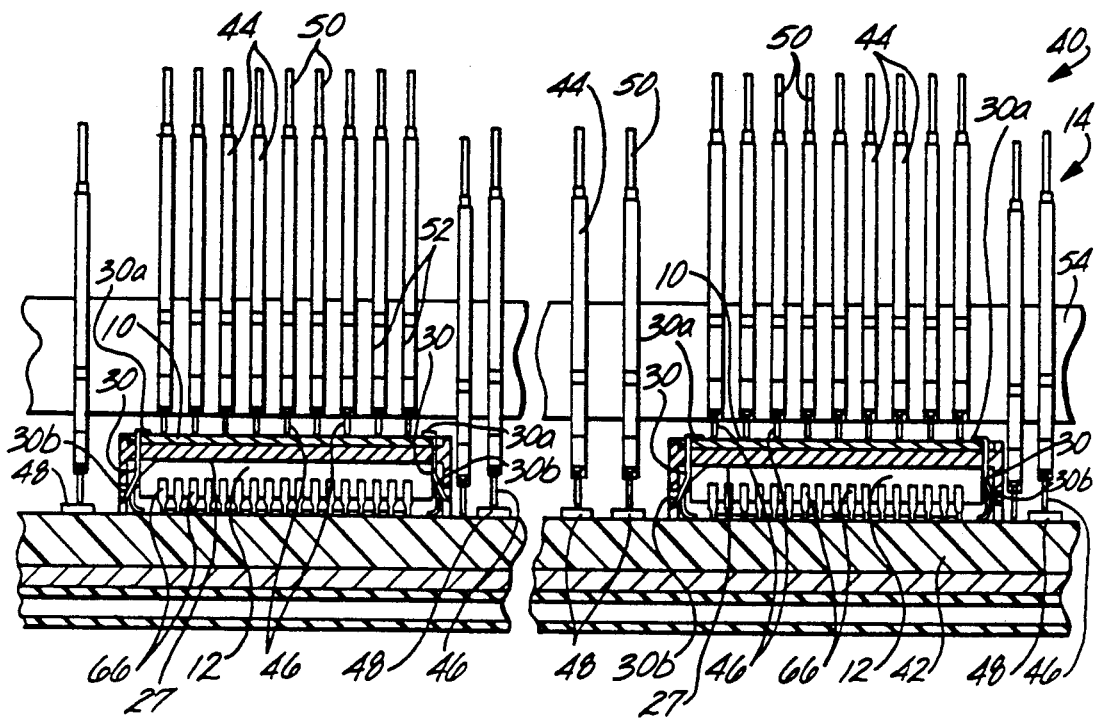
FIG. 4 is a fragmentary semi-schematic side elevation view, partly in cross-section, illustrating use of multiple translator modules with a typical circuit continuity test unit.
Figure 2:
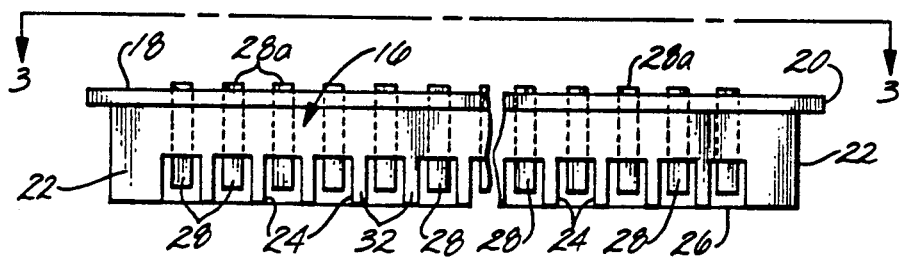
FIG. 2 is a fragmentary semi-schematic side elevation view taken on line 2—2 of FIG. 1.
Figure 3:
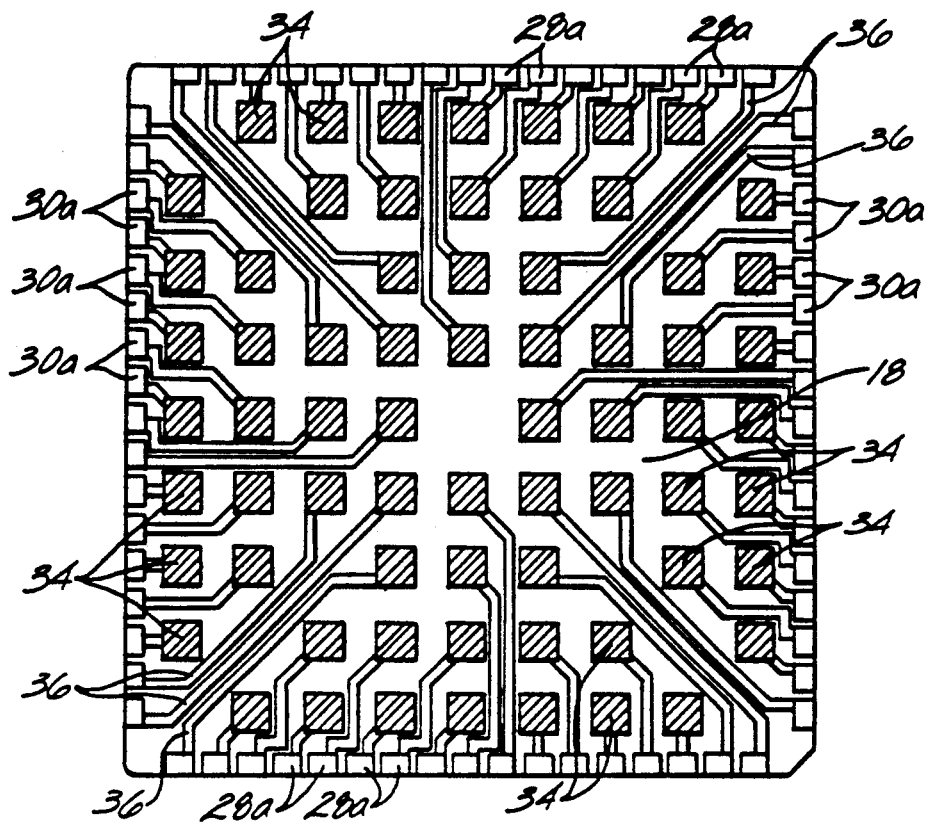
FIG. 3 is a top plan view illustrating detailed construction of internal circuitry within the translator module.

FIGS. 1 through 3 illustrate a translator module 10 adapted for releasable mounting over an integrated circuit package mounted on a loaded printed circuit board. The module 10 is particularly adapted for mounting on an integrated circuit package of the PLCC type. FIG. 4 illustrates an embodiment in which the module is mounted on a PLCC package 12 carried on a circuit board placed in a typical circuit verifying test unit 14.

The translator module 10 includes a housing 16 made from a material having electrical insulating properties. In one form of the invention, the housing is molded from hard plastic. The housing is generally rectangular or square when viewed in top plan view. The housing is molded to provide a flat upper surface 18 which can have a thin peripheral rim 20 extending around the perimeter of the housing above upright side walls 22 arranged rectangularly and extending below the upper surface of the housing. Separate rows of uniformly spaced apart and parallel slots 24 are formed along the underside of each of the four side walls of the housing. The slots are formed so that they open downwardly and extend above a flat bottom surface 26 of the housing. The bottom surface of the housing is parallel to the flat upper surface 18 of the housing. The underside of the housing also has a downwardly facing rectangular recess 27 inside the four outer rows of slots 24.

The bottom side of the translator module has first and second rows of leaf spring contacts 28 disposed in the slots 24 along two opposite side walls 22 of the housing. Third and fourth rows of similar leaf spring contacts 30 are disposed in the slots in the remaining pair of opposite side walls of the housing. The leaf spring contacts 28 in the first and second rows are shown in FIG. 2. FIG. 4 illustrates the leaf spring contacts 30 in the third and fourth rows. The leaf spring contacts 28 and 30 are arranged so that a separate contact is disposed in each of the slots 24 along all four sides of the housing. In the illustrated embodiment, the leaf spring contacts face outwardly in the open slots in the side walls of the housing and are thereby accessible from the exterior of the housing side walls 22. The leaf spring contacts also are mounted in the slots so that they are accessible from below the bottom surface 26 of the housing side walls. In a separate embodiment, the module may have only two rows of contacts in a pair of opposite sides of the module housing, for testing a circuit package having external leads on only two sides. As shown best in the side view of the leaf spring contacts 30 illustrated in FIGS. 4 and 8, each single leaf contact 28 or 30 has a top portion which extends perpendicularly to the plane of the top surface 18 of the housing. The top of each spring is bent over parallel with the top side of the housing as depicted at 30a in FIGS. 4 and 8. Thus, the top face 18 of the housing, as shown in FIG. 1, reveals first and second rows of these bent-over upper portions 28a of the leaf spring contacts 28 on opposite sides of the housing and third and fourth rows of the bent-over upper portions 30a of the leaf spring contacts along the remaining opposite sides of the housing. Referring again to the side view of the leaf spring contacts shown in FIG. 4, the lower portions of the contacts are bent at about their mid-point so that lower portions 28b and 30b of the contacts extend downwardly and outwardly at an angle toward the bottom of the slots in which the contacts are located.

Thus, the leaf spring contacts 28 and 30 are mounted in their individual slots 24 so that the contacts in each row along the four sides of the housing are uniformly spaced apart, extend parallel to one another, and are shielded from one another by the thin molded plastic partitions 32 that separate the slots from one another. Since leaf spring contacts in each row are arranged in their individual slots so that they face outwardly in each upright side wall of the housing while also facing downwardly in their respective slots, the contacts in each row can be urged outwardly toward the exterior of the housing in response to a force acting outwardly on the lower portion of each contact. The leaf spring contacts are adapted in this way to flex outwardly when the module housing is placed over an integrated circuit package having individual rows of leads that engage the leaf spring contacts. This use of the module is described in more detail below.

An array of contact points preferably in the form of planar test pads 34 faces upwardly from the top face 18 of the module 10. The test pads are preferably arranged in spaced apart and parallel rows on a uniform square matrix pattern, although the test pads may be arranged in other patterns if desired. The test pads are arranged so that each test pad located on the upper surface of the module corresponds to a separate one of the leaf spring contacts in the rows of contacts around the outside of the module. Electrical conductor means are provided internally to the housing for making a separate electrical connection between each test pad 34 and its corresponding leaf spring contact. Although various means for providing these separate and independent means of electrical connection can be provided, a preferred technique, illustrated in FIGS. 1 and 3, comprises electrically connecting each test pad 34 with its corresponding contact via separate circuit traces 36 of a conductive material extending from the pad to the bent-over top portion 28a or 30a of the corresponding contact. The electrically conductive circuit traces 36 are preferably applied to the top face 18 of the module by conventional integrated circuit etching techniques. In a preferred arrangement, the test pads 34 and the circuit traces 36 are applied to the top face of a separate printed circuit board 38. The printed circuit board is then mounted in a rectangular recess in the top face of the module housing. The top portions 28a and 30a of the leaf spring contacts 28 and 30, respectively, are bent over to make electrical contact with their corresponding circuit traces 36 after the board 38 is placed on the module. In an alternative technique, the module housing can be formed as a single piece with a flat upper face on which the conductive test pads 34 and their corresponding circuit traces 36 are silk-screened so that the ends of the separate circuit traces 36 make contact with the bent-over upper portions 28a and 30a of the leaf spring contacts 28 and 30.

Thus, the module housing 10 has four rows of uniformly spaced apart exposed leaf spring contacts facing outwardly and downwardly along a rectangular perimeter of the housing; and electrical contact from each spring is translated to a separate planar test pad on the upper face of the housing. As a result, the linear rows of closely spaced apart contacts are translated into a two-dimensionally arranged matrix of test pads in a plane having a surface area sufficient for the test pads to be mutually spaced apart on centers substantially farther apart than the individual in-line spacing of the contacts with which the tests pads are connected. Moreover, the large planar area of the module upper surface also allows individual test pads to occupy a two-dimensional area having a substantial dimension both longitudinally and laterally. In one embodiment, as illustrated in FIGS. 1 and 3, the module housing carries four separate rows of 17 spaced apart leaf spring contacts which are individually spaced apart on 0.050 inch in-line centers. These contacts are translated into the matrix of 68 test pads on 0.10 inch grid centers. The oversized test pads also allow a plus or minus 0.025 inch location tolerance for test probes of the test fixture described in more detail below. Other arrangements involving test modules with different numbers of contacts in each row and a different grid like arrangement of test pads also can be used without departing from the scope of the invention.

Use of the translator module 10 is best illustrated in FIG. 4, which shows a circuit verifying test system 40 for testing a loaded printed circuit board 42. The circuit board includes a plurality of the integrated circuit packages 12 mounted on an upper face of the board. The circuit board can be any of a large number of printed circuit boards having various circuit elements and integrated circuit packages interconnected electrically by etched electrically conductive circuit traces in the well known manner. The modular housing is used on the test systems by first placing a separate module over each circuit package on the circuit board. The modular housing shown in the drawings is especially adapted for mounting on integrated circuit packages of the PLCC type, and the circuit package 12 illustrated in the drawings represents a typical PLCC configuration. However, the translator module also may be adapted for mounting on other integrated circuit packages.

The test fixture 40 illustrated in FIG. 4 includes an array of spring loaded test probes 44. These spring loaded test probes have tips 46 at their lower ends which contact with individual test points 48 in the integrated circuits on the board 42. The types of test points can vary and they are represented schematically at 48 for simplicity. Terminals 50 at the opposite ends of the spring loaded test probes are typically wire-wrapped and electrically connected to a computer controlled circuit verifying system (not shown) in the well known manner. The verifying system tests electrical signals at the various predetermined test points 48 throughout the integrated circuit on the board 42 to verify the continuity or lack of continuity of the circuitry on the printed circuit board. The spring loaded probes 44 are mounted in separately drilled individual holes 52 in a spring probe plate 54 of the test unit. When the spring probe plate is placed over the integrated circuit board 42, the tips 46 of certain spring probes are automatically aligned with predetermined test points 48 of the integrated circuit for verifying electrical continuity at these portions of the circuit under test. For testing the circuitry associated with the integrated circuit packages 12 mounted on the board, the translator modules 10 are first separately mounted on each integrated circuit package. The upper face 18 of each mounted module faces upwardly toward the array of spring probes. The array of spring probes 44 corresponding to each PLCC device 12 is arranged on a pattern in the spring probe plate 54 so that each spring probe contacts a separate one of the test pads on the upper surface of the module during testing, as described in further detail below.

Figure 5:
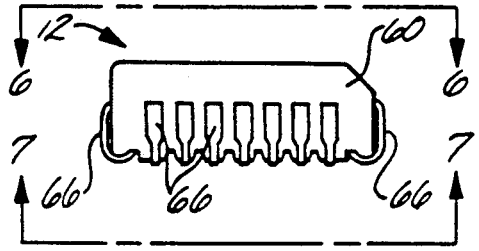
FIG. 5 is a semi-schematic side elevation view illustrating a prior art plastic leaded chip-carrier (PLCC) on which the translator module is used for testing circuit continuity.
Figure 6:
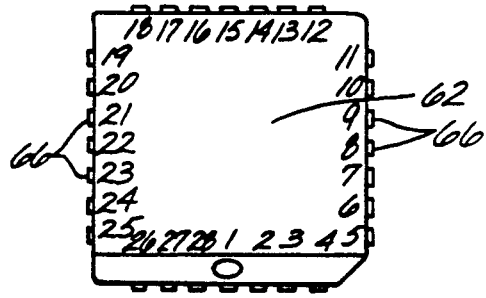
FIG. 6 is a semi-schematic top plan view taken on line 6—6 of FIG. 5.
Figure 8:
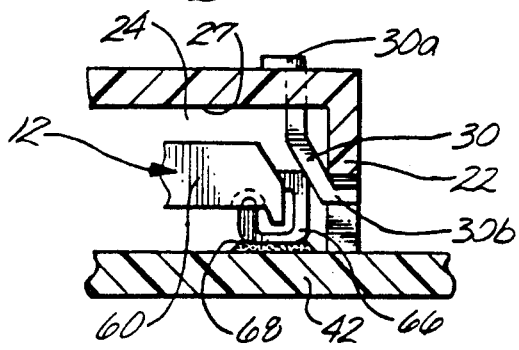
FIG. 8 is a fragmentary semi-schematic side elevation view, partly in cross-section, illustrating a means of contact between the translator module contacts and leads on a PLCC device under test.
Figure 7:
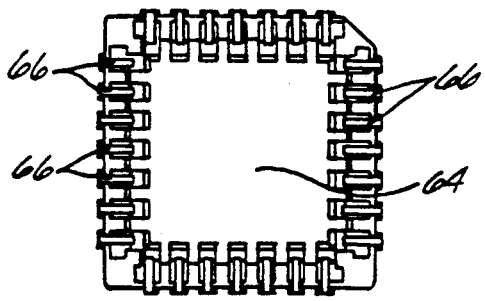
FIG. 7 is a bottom plan view taken on line 7—7 of FIG. 5.

Prior to contacting the tops of the modules with the array of spring probes, the module is placed over the PLCC device by hand in a snap-on friction fit. FIG. 4 illustrates the modules positioned in their snap-on fit over corresponding PLCC devices board 42. To better understand how the translator module attaches to a PLCC device, FIGS. 5 through 7 illustrate the configuration of a typical PLCC package which includes a housing comprising a rectangular plastic block 60 having flat upper and lower surfaces 62 and 64. The PLCC housing typically contains computer memories and microprocessors in integrated circuit chip form. The illustrated PLCC device is a 28-pin arrangement having leads 66 formed in a "J" shape projecting downwardly from all four side walls of the housing. In the illustrated embodiment, there are seven uniformly spaced apart and parallel "J" leads 66 projecting from each planar side face of the housing. Each "J" lead extends outwardly along the outside of the side face of the block, closely spaced from and parallel to the upright side wall of the block. The lead is then curved underneath the block and extends into a corresponding slot at the bottom of the block. The bottom portion of each "J" lead protrudes downwardly below the bottom of the block sufficiently to be attached to a corresponding location on a printed circuit board. FIG. 8 illustrates a "J" lead 66 of the PLCC device 12 attached to the printed circuit board 42 by electrically conductive soldering 68. The PLCC device as shown in FIGS. 5 through 7 is for illustration purposes only inasmuch as various PLCC configurations ranging in pin sizes from 20 to 68 pins, for example, are presently available and can be used with various forms of the translator module of this invention.

As mentioned previously, a separate translator module is placed on each PLCC device by hand in a snap-on friction fit. The module is placed over the PLCC housing by first placing the bottom surface of the module over the top of the PLCC device to align the rows of contacts 28 and 30 along the sides of the module with corresponding "J" leads 66 on the PLCC device. The translator module is then pushed downwardly onto the PLCC device with a downwardly directed force so that each of the leaf spring contacts 28 and 30 is forced downwardly against a corresponding "J" lead so as to flex the leaf springs outwardly sufficiently to hold them in tension to thereby hold the module on top of the PLCC device in a snap-on friction fit. The underside of the module is hollowed out at 27 to accommodate the rectangular configuration of the PLCC housing. The bottom edge 26 of the module housing rests against the top surface of the printed circuit board when the module is in place on the circuit package. The leaf springs are forced outwardly into the configuration shown in FIG. 8 from their engagement with the leads on the PLCC device, the contacts are held under tension in that position to provide the frictional snap-lock engagement for holding the module on the PLCC device. In a circuit board having a number of these PLCC devices positioned in any of various patterns across the surface of the board, individual translator modules can be rapidly placed on corresponding PLCC devices prior to test. The array of spring probes in the probe plate 54 is arranged in a pre-determined pattern that automatically aligns the spring probes with the test pads 34 on each module.

Testing is then carried out by the usual step of drawing the spring probes into contact with the various test points in the circuit under test. In the example illustrated in FIG. 4, the test fixture can include a platen 70 at the bottom of the test unit on which the printed circuit board is mounted, together with a bellows 72 below the platen. The bellows can be expanded under pressure to force the platen upwardly to draw the spring probes into pressure contact with the circuit test points. Pressure within the bellows maintains the contact pressure between the bottoms of the spring probes and the test points in the circuit during circuit verification by the test unit. The test unit illustrated in FIG. 4 is by way of example only. Other test units such as vacuum-actuated test units, for example, also can be used.

The translator module translates densely packed in-line spacing of contacts on integrated circuit packages into a much wider spaced apart grid of oversized test pads for allowing substantial tolerances in the contact between the test unit test probes and the test pads on the module. Standard probes can be used and no milling or special machining is required for placing the probes in a position to test circuits produced by connections to any or all of the leads from the integrated circuit package. The leaf spring contacts also supply low initial contact force for ease of manual insertion of the integrated circuit package into the module. Under the force generated by probe compression, the leaf springs supply additional force complimented with a smooth wiping action to ensure good electrical contact. In one embodiment, the leaf springs can be configured at an angle so that when pressure from the probe plate is released the module moves away from the integrated circuit package automatically. The translator module also provides reliable circuit continuity to the test unit. Because the pads can be made large, rotation of this module due to a misaligned integrated circuit package does not prevent a spring probe from remaining in contact with a corresponding pad. Also, the rectangular or preferably square shape of the pads allows large spacing between the pads to be maintained while maximizing contact area on the pads. The module is especially useful in testing multiple circuit packages which are closely spaced from one another on the circuit board. The module, when mounted on a circuit package, occupies minimal space around the package. The arrangement of the leaf spring contacts in the slots, which can be open to the sides and bottom of the module, makes it possible to place the module in its operative position by a straight downward movement over the leads on the circuit package. Since the leaf spring contacts are supported from above, they require no supporting structure that occupies the lateral space around the perimeter of each integrated circuit package.

FIGS. 9 through 13 illustrate an alternate embodiment of the translator module. In this embodiment, the module is made from a metalized plastic "flex-circuit" material. FIG. 9 is an exploded perspective view showing individual elements of the alternate flex-circuit module in their final form before assembly. FIG. 10 is an exploded perspective view illustrating elements of the translator module during an early stage of the process for making the module. FIG. 11 is a view illustrating the elements of FIG. 9 assembled together and stamped into a desired shape before the stamping is formed into a finished translator module shown in FIGS. 12 and 13. FIGS. 14 and 15 are alternate embodiments of the flex-circuit test module of FIGS. 9 through 13.

Referring to FIG. 9, the flex-circuit module comprises a thin, flat, flexible plastic outer sheet 74 for forming an outer housing of the module; a circuit pattern 76 made from an electrically conductive material such as copper; an insulator film such as a thin, flat plastic backing sheet 78; and a rigidizing member 80 made from a more rigid supportive backing material.

The outer sheet 74 is preferably made from a thin flexible self-supporting plastic sheeting A preferred material is a 20 mil thick sheet of polycarbonate resin such as the material known as Lexan, a trademark of General Electric Polymers Product Dept. The plastic material from which the outer sheet is made is capable of being shaped by a stamping process and is capable of being heat formed into a desired three-dimensional shape. The material also is spring-like in a sense that it retains a memory sufficient to spring back to a preset position after a bending force is released. The Lexan sheet 74 shown in FIG. 9 represents the results of two separate steps in the process of forming the flex-circuit module. The outer sheet 74 is a generally rectangular-shaped piece having a large central region with an array of cut-out holes 82 extending through the depth of the sheet. The cut-out holes are each generally rectangular in shape to match the shape of corresponding test pads for the flex-circuit module. The cut-out holes 82 are preferably formed by an initial stamping process. At a later stage of the process, four rows of mutually spaced apart and parallel flexible plastic spring-like fingers 84 are formed along the four sides of the rectangular sheet 74. The plastic fingers 84 are each long and narrow and semi-flexible. The fingers are of uniform length and width and are uniformly spaced apart with thin, narrow spaces between them. Each of the fingers is able to flex independently of the other fingers. Each row of fingers is spaced inwardly from the adjacent opposite corners of the sheet 74. This facilitates later folding or shaping of the outer sheet into a three-dimensional box or cube shape described below. The outer fingers 86 in opposite first and second rows of fingers are wider and have projections 88 for interlocking with corresponding recessed edges 90 of wider fingers 92 at the opposite ends of the other two rows of fingers. The wider fingers 86 and 92 at the ends of the row are interlocked during a later stage of the process in which the sheet 74 is formed into a box shape for forming an outer housing of the flex-circuit module. The rows of fingers are formed by a stamping process described below.

The conductive circuit pattern 76 is initially made from a thin, flat, continuous sheet of electrically conductive metal such as copper, approximately 2 to 5 mils thick. At this thickness, the copper layer is in thin, self-supporting sheet form. The copper sheet is preferably roll bonded initially to the plastic insulator film 78 and then later etched away to form the conductive circuit pattern shown at 76 in FIG. 9. In this embodiment, the plastic film 78 serves as a carrier for the etched metal circuit pattern. Alternatively, the conductive circuit pattern 76 can be formed by stamping a separate conductive metal sheet into the illustrated configuration. As a further alternative, the conductive circuit pattern can be formed on a flexible carrier by printed circuit techniques. The conductive circuit pattern 76 comprises an array of contact points, preferably in the form of planar test pads 94 arranged in spaced apart and parallel rows on a uniform square matrix pattern, although other patterns may be used if desired. The test pads are arranged so they lead to separate, elongated, thin metal conductor elements 96, which generally fan outwardly from the matrix of test pads to corresponding conductive metal fingers 98 arranged in rows along the four peripheral side portions of the circuit pattern. The conductive metal fingers 98 are of uniform length and width and have uniform spacing between them so as to match the pattern of corresponding flexible plastic fingers 84 on the outer sheet 74.

The insulator film sheet 78 preferably comprises a thin, flexible plastic film capable of being shaped by a stamping process and also capable of being heat-formed into a desired shape. The material is especially one to which the conductive metal film can be roll bonded prior to etching away to form the flexible circuit pattern 76. In a preferred form, the insulator film 78 comprises a 2 mil thick polyamide film such as Kapton, a trademark of Du Pont.

The rigidizing member 80 comprises a semi-rigid plastic sheet such as an approximately 30 mil thick piece of G-10 fiberglass.

FIG. 10 illustrates a preliminary step in the process for making the flex-circuit translator module. This illustration shows the flexible outer plastic sheet 74 aligned above a copper lead frame 100 having a stamped or etched conductive circuit pattern. The illustration shows the circuit pattern 76 with the centrally located array of conductive pads 74 which fan out to the long narrow conductive metal fingers 98 around the outside of the circuit pattern. The copper lead frame 100 also includes rectangular cut out hole 102 at the four corners of the circuit pattern. The lead frame 100 simply illustrates any of various intermediate steps in the process in which the circuit pattern 76 is formed from a continuous thin copper sheet. In the illustrated embodiment, the lead frame 100 would more likely represent a stamped lead frame in which each of the conductive circuit elements extends from the central test pads 94 out to their corresponding fingers 98, which, in turn, are integral with a rectangular outer peripheral frame 104. Alternatively, the lead frame 100 can represent an etched circuit pattern in which case the continuous thin copper sheet is preferably first roll bonded to the thin flexible plastic carrier film 78. This plastic sheet has large cut-out holes 106 aligned with the portions of the copper sheet at which the four rows of conductive fingers 98 will be formed. After roll bonding the thin copper sheet to the plastic sheet 78, the copper is etched away so that the array of conductive test pads 94 are formed over a central region 108 of the plastic sheet, while the conductive fingers 98 of the circuit pattern 76 bridge the cut-out holes 106. The width of the cut-out holes 106 can be slightly less than the length of the fingers so that each of the copper fingers 98 is bonded to the plastic carrier film 78 on opposite sides of the cut-out holes 106.

The outer plastic sheet 74, the lead frame 100 and the insulator sheet 78 are then overlaid and bonded to one another as a composite sheet, after which the resulting composite sheet is stamped to form a composite stamping 110 shown in FIG. 11. The outer plastic sheet 74 is bonded to the intermediate conductive copper layer by a suitable adhesive such as a heat-curable adhesive which is cured at a later stage of the process. The individual layers of the composite sheet also are preferably adhered to one another by a roll bonding technique in which the overlying layers are pressed between a pair of platens which apply heat and pressure to form the continuous flexible composite sheet prior to the stamping process. The multi-layer stamping 110 thus comprises the outer plastic layer 74 with the cut-out holes 82 aligned with the conductive metal test pads 94 at the base of each cut-out hole. The intermediate conductive metal layer of the stamping has the conductive metal elements 96 fanning outwardly from the array of upwardly facing test pads 94 toward the conductive metal fingers 96 on the underside of the corresponding plastic fingers 84. The base of the stamping comprises the insulator film 78 having its rectangular outer periphery inboard from the inner ends of the conductive fingers which extend around the periphery of the stamping.

The composite flexible stamping 110 is next formed into a three dimensional, downwardly opening box-shaped translator module 112 shown in FIG. 12. The module is preferably formed by placing the stamping 110 over a die (not shown) and applying heat to heat-set the composite sheet in the box shaped form shown in FIG. 12. The wider fingers 86 and 92 at the four corners of the module are then interlocked and glued together. These wider corner regions of the module provide rigidizing members at the corners of the module and also provide stand-off members to reduce stress on the integrated circuit package during use of the module. In a preferred technique of forming the three dimensionally shaped module, the four rows of fingers are bent at the base with a jig with cam angles that heat-set the fingers at a small angular offset from 90° to the top plane of the module. The fingers 86 and 92 at the four corners of the module are set at preferably a 90° angle relative to the top plane of the module; but the rows of fingers along the sides of the module are angled inwardly slightly so that lower portions of the fingers extend a short distance into the interior region under the module, relative to the tops of the fingers. In this way, when the module is placed over an integrated circuit package, the enclosed area at the bottoms of the fingers is slightly undersized relative to the enclosed area of the exterior leads, so that the bottom portions of the fingers are spread outwardly by the corresponding leads and are held under tension.

FIG. 13 illustrates a cross-sectional view of the completed module. This view shows the top insulating film layer 74 which forms the outer surface of the module housing. The cut-out holes 82 are shown in a central portion of the outer insulating layer 74. The conductive metal layer includes the test pads 94 shown at the base of the cut-out holes 82. The conductive elements 96 are shown extending outwardly from the test pads to the metalized inner faces of the spring-like fingers at the periphery of the module. These metalized portions of the spring-like plastic fingers 84 are preferably of narrower width than their corresponding fingers 84. This is shown in elevation at 98' in FIG. 13. The insulating sheet 78 is shown as a backing sheet for the metalized conductive circuit pattern, and the outer periphery of this insulating sheet is bent downwardly around the corners of the module as shown at 78'. As a final step in the process, the rigidizing member 80 is bonded to the underside of the module after the module is formed. The rigidizing member provides structural strength for the top surface of the module to resist the downward pressure of the test probes during use for protecting the integrated circuit package tested during use of the module.

FIG. 14 illustrates use of the flex-circuit module 112. This view illustrates a PLCC housing 60 with one of a multiplicity of "J" leads 66 projecting from the exterior of the housing. The translator module is placed over the PLCC device by hand in a spring-like friction fit, so that the spring-like fingers are aligned with the rows of "J" leads along the PLCC device. The translator module is pushed downwardly onto the PLCC device with a downwardly directed force so that each of the leaf spring type fingers on the module is forced downwardly against a corresponding "J" lead so as to flex the fingers outwardly sufficiently to hold them in tension and thereby hold the module on top of the PLCC device. Thus, the inwardly facing metalized portions of the flexible plastic fingers are held in contact with the "J"

leads. Since the underside of the module is hollowed out, it accommodates the rectangular configuration of the PLCC housing. The bottom of the module housing can rest against the top surface of the printed circuit board when the module is in place on the circuit package. The spring-like fingers are forced outwardly into the configuration shown in FIG. 14 where the fingers are held under tension in that position because of their normally undersized relationship relative to the projected area around the outer edges of the "J" leads. In a circuit board having a number of these PLCC devices located in various patterns across the surface of the board, these individual translator modules can be rapidly placed on corresponding PLCC devices prior to testing. The array of spring probes 44 in the test unit have spring biased tips 46 which register with corresponding cut-out holes 82 in the top of the module, for contact with the corresponding test pads 94 at the base of the cut-outs. Testing is then carried out by the usual step of drawing the spring probes into pressure contact with the various test points in the circuit under test. In one embodiment, the flexible plastic fingers can be spaced apart on 50 mil centers, while this spacing is translated to the array of test pads at the top on 100 mil centers, or more. When the translator module is removed from the PLCC device the plastic metalized fingers spring back inwardly to their normal undersized orientation around the periphery of the module owing to the "memory" of the plastic outer portions 84 of the spring-like fingers. The memory of the spring-like flexible fingers can be provided, in part, by the inherent memory of the thin copper sheet.

FIGS. 15 and 16 show alternative embodiments of the flex-circuit test module. In the embodiment of FIG. 15, the cut-out holes 82 in the top insulating layer 74 of the module can be filled with metal inserts 114. In the embodiment of FIG. 16, the cut-out holes 82 can contain a ring-like metal insert 116 which can enhance electrical contact either with the inside wall of the insert itself or with the test pad 94 at the base of the cut-out 82.

FIGS. 17 through 20 illustrate an alternative embodiment of a translator module made from a composite metalized plastic flex-circuit material. FIG. 17 is a semi-schematic top view of the composite flex-circuit used to form the alternative module. This view illustrates the test pads and metalized spring-like contact fingers schematically, with elements of the combination shown enlarged and out of proportion for simplicity. FIG. 18 is a schematic cross-sectional view taken on a plane through FIG. 17. FIG. 19 illustrates a method for assembling the composite flex-circuit of FIGS. 17 and 18 to form an alternative embodiment of the flex-circuit type translator module. FIG. 20 is a schematic cross-sectional representation, in an enlarged proportion, illustrating the detailed structure of the alternative flex-circuit module.

Referring to FIGS. 17 and 18, the alternative flex-circuit module is made from a composite metalized plastic flex-circuit sheet which includes an outer layer 120 of a flexible self-supporting plastic film; an inner metalized film 122 of electrically conductive metal, such as copper or a beryllium-copper alloy, for example; and a bottom layer 124 of a flexible self-supporting plastic film. The metalized layer 122 which is sandwiched between the outer plastic film 120 and the bottom plastic film 122 is preferably formed into a desired circuit pattern by techniques similar to those described above.

In one embodiment, the circuit pattern formed by the conductive metal film can be similar to the circuit pattern 76 illustrated in FIG. 9. Generally, the conductive circuit pattern will be made from a thin, flat continuous sheet of electrically conductive metal approximately 2 to 5 mils thick. At this thickness, the metal layer is in thin self-supporting sheet form. The metal sheet is preferably roll bonded between the outer film 120 and bottom film 124 of the composite flex-circuit. As shown in FIG. 17, the conductive circuit pattern comprises an array of contact points in the form of planar test pads 126 arranged in spaced apart and parallel rows, preferably on a uniform square matrix pattern. The test pads are arranged so they lead to separate elongated thin metal conductor elements 128 which generally fan outwardly from the matrix of text pads to corresponding elongated conductive metal fingers 130 arranged in rows along the four peripheral side portions of the circuit pattern.

In a preferred form of the invention, the plastic film sheets 120 and 124 comprise an approximately 4 mil thick polyamide film such as Du Pont's Kapton. The bottom film 124 is preferably a continuous sheet, in the initial steps of the process; whereas cut-out areas are formed in the outer film sheet 120 in alignment with the test pads 126 and the conductive fingers 130 of the conductive circuit pattern. This arrangement is best illustrated in FIG. 17 which shows an array of cut-out holes 132 extending through the depth of the outer film sheet 120. These cut-out holes are generally rectangular in shape and arranged on a pattern which matches the shape of and is aligned with corresponding test pads 126 of the metalized circuit pattern. Similarly, elongated cut-out holes 134 are formed in the outer film 120 in alignment with the conductive metal fingers 130 of the circuit pattern. The illustration in FIG. 17 shows the cut-out holes 132 and 134 exaggerated in size and out of proportion for clarity.

Once the composite flexible metalized sheet of FIGS. 17 and 18 is formed, the composite sheet is then stamped into a configuration similar to that illustrated in FIG. 11. The multi-layer stamping 136 is illustrated in FIG. 17 as a single layer for simplicity. The cross-sectional view of FIG. 20 illustrates the multi-layer cross-sectional configuration. The resulting stamping 136 has the array of conductive test pads 126 exposed in the central region of the composite stamping through the individual spaced apart cut-out holes 132. The contact fingers 130 of the circuit pattern are formed into individual metalized spring-like contacts 138 in which the conductive fingers 130 are exposed through the cut-outs in the outer layer 120 of the composite sheet. The individual flexible spring-like conductive metal contacts 138 have a metalized outer surface provided by the metalized conductive fingers of the circuit pattern, while the bottom layer 124 of the flex-circuit acts as a backing sheet for the contacts. The composite stamping is next formed into a three-dimensional downwardly opening box-shaped translator module 140. The module is formed by placing the stamping over a folding fixture (not shown) and then folding the ends of the contacts 138 back on themselves, as shown best at the right side of FIG. 19, so as to form individual flexible spring-like conductive fingers of double thickness around the peripheral outer edges of the module. Preferably, the fold-over portions of the fingers are bonded together by a suitable adhesive 142. Once the module is formed with the fold-over flexible fingers, a flat rigidizing member 144 such as a semi-rigid plastic sheet, approximately 30 mils thick, of G-10 fiberglass, is bonded to the top inside portion of the module.

FIG. 20 illustrates a cross-sectional view of the completed module 140. This view shows the top insulating film layer 120 which forms the outer surface of the module housing. The cut-out holes 132 are shown for exposing the conductive metal pads 126 at the top of the module. The conductive elements 128 are shown extending from their individual test pads 126, wrapping around the outer ply of the fold-over fingers and leading to the exposed conductive metal faces 130 of the contacts which are exposed to the inside of the module.

In using the flex-circuit module 140, the process is similar to that described for the flex-circuit module 112 above. The translator module is placed over the PLCC device so that the individual spring-like fingers are aligned with the leads along the PLCC device. When the module is pushed downwardly onto the PLCC device, each of the leaf spring-type fingers of the module is forced downwardly against the corresponding leads so as to flex the fingers outwardly sufficiently to hold them in tension and thereby hold the module on top of the PLCC device. Further testing is carried out in a manner described above. The spring-like fingers 138 are held in tension inasmuch as they normally are undersized relative to the projected area around the outer edges of the PLCC leads. The spring-like action of the individual fingers 138 is produced, in part, by the memory of the plastic film 120 and 124 and, in part, by the inherent memory of the metal stamping. As with the other embodiments, the flexible plastic fingers are spaced apart closer than the spacing between the individual test pads at the top of the module. When the module is removed from the PLCC device, the plastic metalized fingers spring back inwardly to their normally undersized orientation around the periphery of the module, owing to the memory of the spring-like fingers.

An advantage of the translator module embodiment of FIGS. 17 through 20 is that the exposed portions of the circuit pattern (the test pads 126 and conductive fingers 130) need only be exposed to one side of the composite flex-circuit material. The resulting composite material is then simply wrapped into the desired configuration to expose these portions of the circuit pattern to the top side and the peripheral inside portions of the resulting module. The result is a reduced manufacturing cost for the flex-circuit module.

Thus, the flex-circuit test module of this invention provides additional space saving advantages. The PLCC's on the loaded printed circuit board can be mounted closer to one another with the narrowest of board space between them, and yet the test module eliminates any substantial housing thickness of the module around the outside of the PLCC device and thereby occupies little board space during test. In addition, the holes in the top of the module register with corresponding test pads at the base of each hole, and this array of holes provides an additional means for ensuring separate electrical contact between each test probe and a corresponding test pad. Further, the flex-circuit test module provides a substantial cost savings in materials and tooling costs when compared with a molded plastic module, for example. The result of the invention is that printed circuit boards having densely packed PLCC devices with closely spaced leads that are not now possible to be tested can easily be tested with 100% efficiency with the test module of this invention.

FIGS. 21 through 24 illustrate alternative embodiments of a further form of the invention in which a translator module is carried on the end of an elongated flexible cable. The translator module is adapted to be placed manually over integrated circuit packages under test, and test signals are conducted from the translator module via the cable to the circuit continuity test unit. In the embodiment illustrated in FIG. 21, a translator module 150 comprises a housing 152 with rows of spaced apart spring like contacts 154 along oppositely facing sides of the module housing. This translator module can be similar to the translator module 74 illustrated in FIG. 12 in which the module is made from a flex-circuit material; although the translator module also can be similar to the translator module 10 illustrated in FIG. 1, if desired. In the translator module 150 an array of conductive pads 156 is located on the top surface of the housing. As with the module 74 shown in FIG. 12, these conductive pads 156 are internally connected electrically to corresponding circuit traces leading to respective ones of the conductive metal traces on the spring like contacts 154 at the edges of the module housing. The conductive pads 156 on the module housing provide a means for electrically connecting the separate contacts on the module housing to corresponding electrical leads in an elongated flexible cable 158. In the illustrated embodiment, the cable 158 is made from a flex-circuit material similar to that described above. Briefly, the cable 158 includes a thin film sheet of an electrically insulating plastic film material such as Du Pont's Kapton. Individual electrically conductive leads 160 in the form of separate metal traces are formed internally in the cable between exterior film sheets of the Kapton. (Only a portion of the leads 160 are shown in FIG. 21 for simplicity.) The leads 160 are electrically connected to corresponding conductive metal traces that form separate contacts 162 at the end of the cable. The contacts 162 are exposed to the bottom of the cable, and the conductive pads 156 on the housing 150 are exposed to the top of the housing. The array of contacts 162 matches the array of pads 156 on the module. The individual contacts 162 are reflow-soldered to corresponding pads 156 on the housing, and the top of the housing is bonded to the end of the cable by a suitable bonding material such as an epoxy adhesive. A suitable adapter 164 at the opposite end of the flex-circuit cable 158 has terminal contacts (not shown) for connection to terminals in a circuit continuity test unit (not shown).

In use, the translator module 156 is adapted for being manually placed over each of a plurality of corresponding integrated circuit packages. The current packages may be on a loaded printed circuit board. The contacts 154 on the housing make contact with corresponding electrical leads on the integrated circuit package, and test signals are conducted from the contacts on the module housing via the cable 158 to the test unit.

Figure 22:
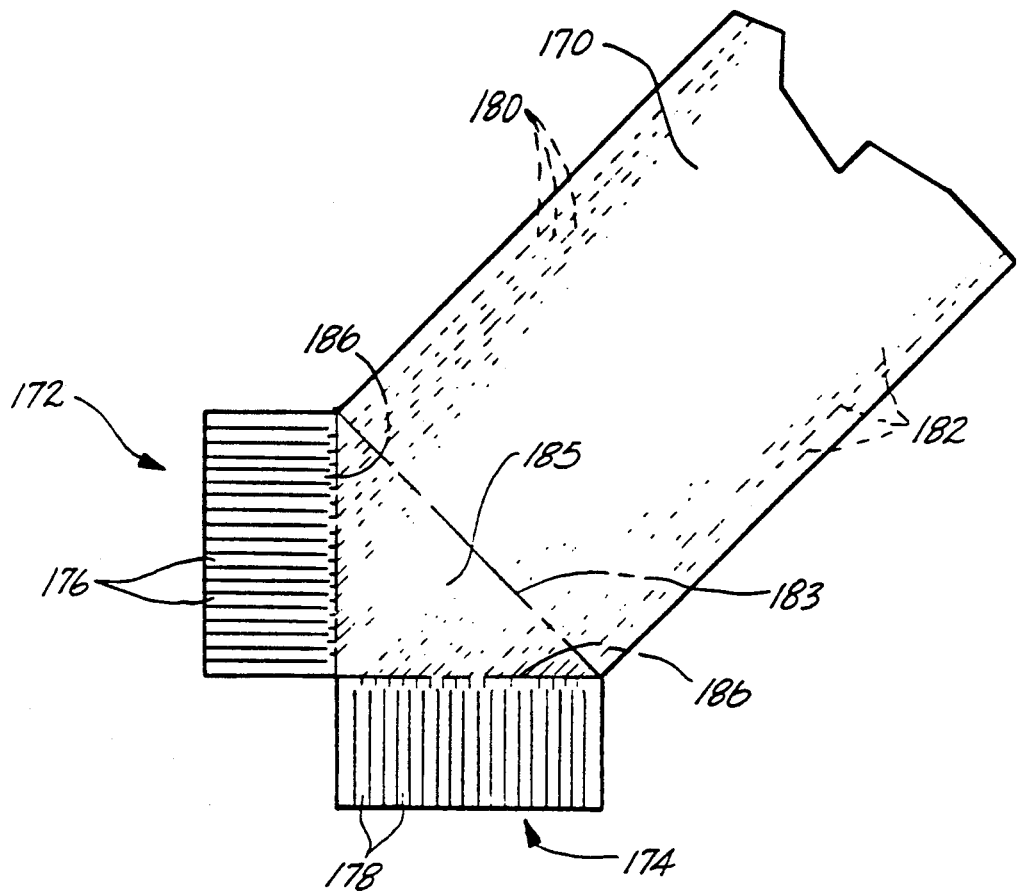
FIG. 22 is a semi-schematic top plan view illustrating a portion of an alternative embodiment of a translator module integrally formed with a flex-circuit cable.
Figure 23:
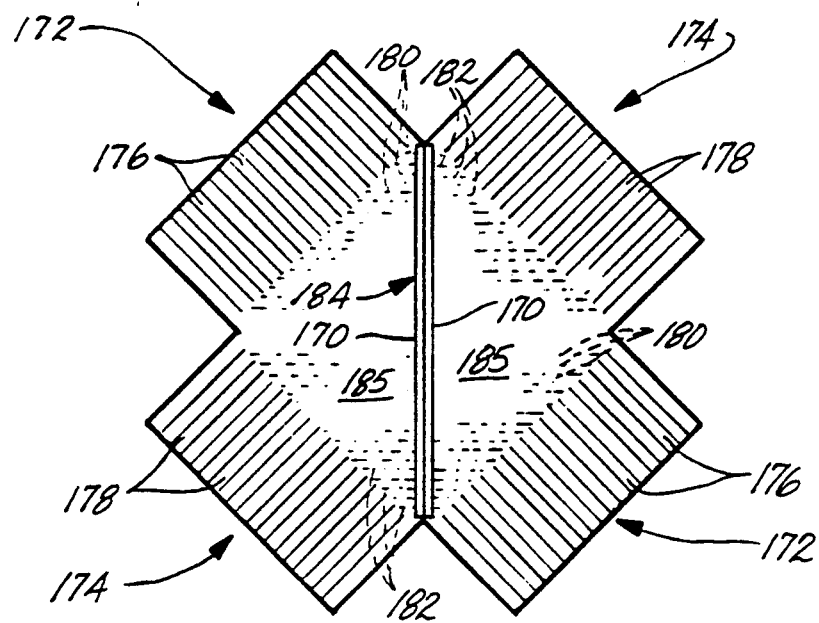
FIG. 23 is a semi-schematic end elevation view illustrating an intermediate step in the process of forming a translator module integrally formed with the end of a flex-circuit cable.
Figure 24:
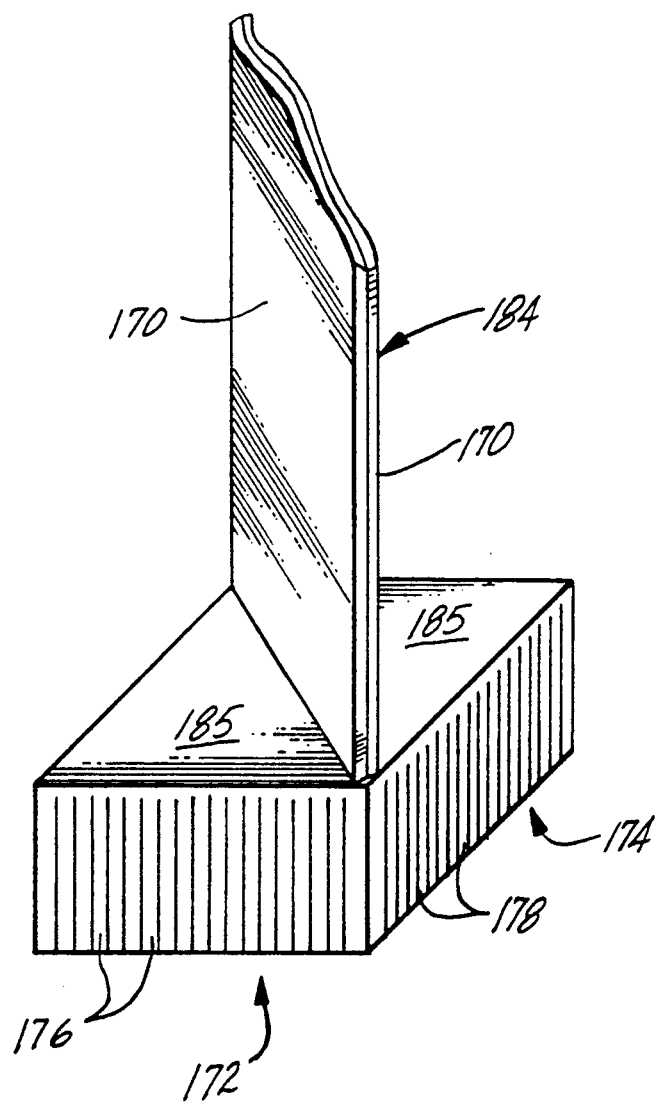
FIG. 24 is a semi-schematic perspective view illustrating a completed test module and flex-circuit cable formed by the preliminary steps illustrated in FIGS. 22 and 23.

FIGS. 22 through 24 illustrate an alternative embodiment of a translator module connected to the end of a flex-circuit type cable in which the portions of the translator module housing are integrally formed with a portion of the cable. Although various techniques can be used to form such a translator module and integral flex-circuit cable, FIG. 22 illustrates a preliminary step in a presently preferred process. FIG. 23 illustrates an intermediate step in the process of forming the finished integral translator module and flex cable shown in FIG. 24.

FIG. 22 illustrates one-half of a two-piece composite translator module and flex cable combination. The half illustrated in FIG. 22 is a flat-form piece of flex-circuit material which includes an elongated flex-circuit cable 170 with a first group 172 and a second group 174 of spaced apart contacts projecting from different end portions of the cable. The first group 172 of contacts is arranged as a series of flex-circuit type fingers 176 spaced apart along a generally rectangular tab that projects from one end portion of the cable. The second group 174 of contacts is arranged as a similar series of flex-circuit type fingers 178 spaced apart along a generally rectangular tab that projects from an adjacent end portion of the cable. The two groups of tabs are positioned at right angles to one another, and each group is aligned along an axis at a 45° angle to the longitudinal axis of the cable. A first group of electrically conductive leads 180 comprises separate metal traces continuous with the conductive metal traces on respective ones of the flexible conductive fingers 176 in the first group 172 of contacts. Similarly, a second group of electrically conductive leads 182 comprises separate metal traces continuous with the conductive metal traces on separate ones of the flexible conductive fingers 178 of the second group. The metal traces 180 and 182 extend the length of the flexible cable 170 to provide a means for conducting test signals from the contacts 176 and 178 to a circuit verification test analyzer via an adapter (not shown) on the opposite end of the cable 170. Preferably, the integral flex cable and translator module combination shown in FIG. 22 is made from a flexible plastic sheet film such as Kapton with the separate metal traces bonded to one side of the Kapton sheet in a manner similar to the other flex-circuit combinations described previously.

FIG. 23 illustrates an intermediate step in the process of forming the finished integral flex cable and translator module combination, in which the half shown in FIG. 22 is placed back-to-back with an identical half, and the two halves are then folded along a diagonal fold line 183 so the cable portion 170 of each half extends at a right angle to the plane of the first and second groups 172 and 174 of contacts. This leaves a triangular portion 185 of the flex-circuit material at a right angle to the end of each cable portion 170, with four groups of contacts in a common plane at the end of the composite flex-cable 184. The overlying flex cable portions 170 can be bonded to one another by an epoxy adhesive or the like to form the composite flex cable 184. The electrically conductive leads 180 and 182 on each side of the flex cable combination 184 are electrically isolated from one another either by proper positioning of the leads on the respective cable portions 170, or by placing a thin sheet of insulating material between the two flex cable portions 170.

FIG. 24 shows the completed translator module and integral flex cable combination in which the completed three dimensional module housing 184 has been formed by folding the tab portions of the flex circuit material along fold lines 186 and securing the ends of the contact groups together to form a flex-circuit housing similar to the housing 74 shown in FIG. 12. This housing is thus integrally formed at the end of the composite flex cable 184.

In use, the combined translator module and flex cable combinations shown in FIGS. 21 or 24 are preferably used by placing the module housings over the integrated circuit package under test. Preferably, the modules over individual circuit packages manually. Each module is placed over an integrated circuit package so that the individual spring-like fingers on the housing are aligned with and contact the leads along the integrated circuit package. When the module is pushed downwardly over the integrated circuit package, the leaf spring type fingers of the module are forced downwardly against the corresponding leads so as to flex the fingers outwardly sufficiently to hold them in tension and thereby hold the module on top of the integrated circuit package. Testing is then carried out by conducting test signals from the translator module along the flex cable to the test verification unit to which the cable is connected. The translator module then can be removed from the integrated circuit package and the plastic metalized fingers spring back inwardly to their normal position owning to the memory of the fingers.

Figure 25:
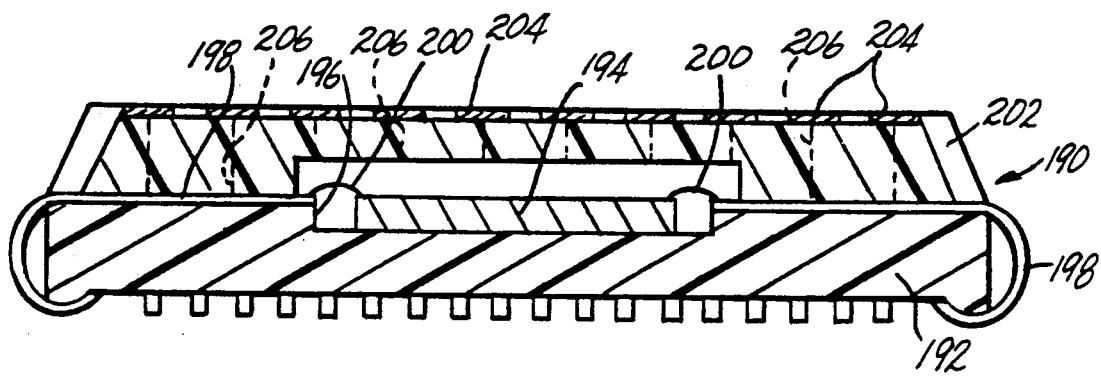
FIG. 25 is a semi-schematic cross-sectional view illustrating an alternative embodiment of the invention in which a circuit continuity test unit is integrated into an integrated circuit chip package or housing.
Figure 26:
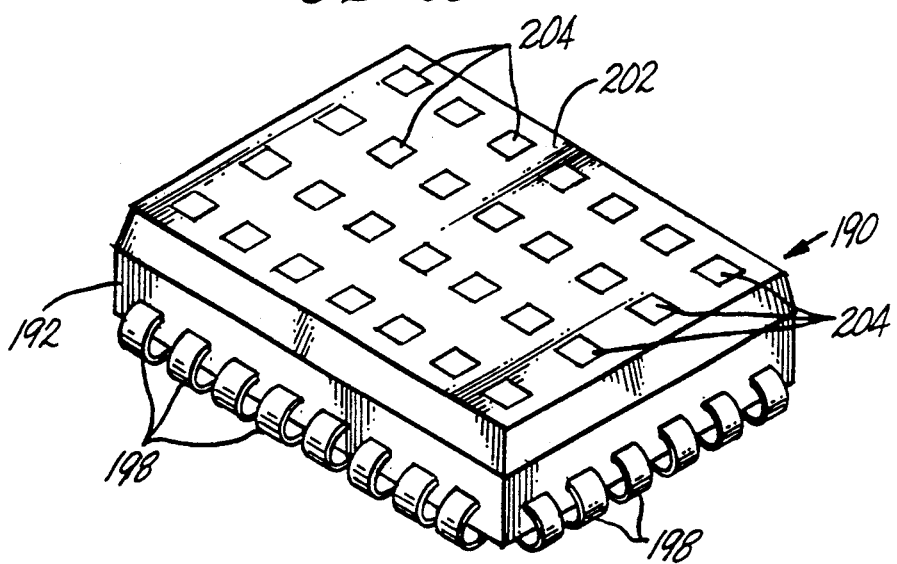
FIG. 26 is a semi-schematic perspective view illustrating the integrated circuit chip package containing the built-in circuit continuity test unit.
Figure 27:
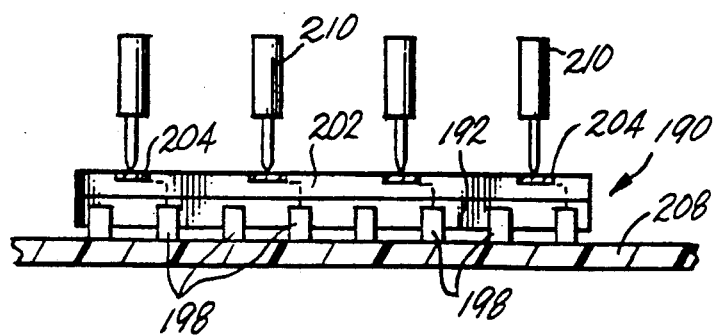
FIG. 27 is a fragmentary semi-schematic side elevation view illustrating testing of an integrated circuit chip package with built-in test unit.

FIGS. 25 through 27 show an alternative embodiment of the invention in which a circuit continuity test system is integrated into an integrated circuit (IC) chip carrier 190. In this embodiment, a plastic leaded chip carrier (PLCC) includes a carrier base 192 made from a polymeric material to provide electrical insulating properties. An integrated circuit 194 is mounted in a cavity 196 located in a central region of the upper surface of the carrier. Separate conductive metal leads 198 fan outwardly along the upper surface of the carrier. The leads extend away from the cavity and around the outer side edges of the carrier to the bottom peripheral portion of the carrier. These leads are shown in a J-lead configuration in which the separate leads are spaced apart along the opposite side edges of the carrier and project downwardly from the bottom peripheral edge of the carrier with uniform mutual spacing between the leads. Each lead is individually connected electrically to a corresponding terminal on the integrated circuit 194 by separate metal wires 200. Conventional wire bonding techniques are used to connect the wires to the integrated circuit. A plastic cover plate 202 encloses the integrated circuit 194 within the IC package.

An array of test access pads 204 are located on the top surface of the cover 202. The test access pads are electrically connected internally to the J-leads 198. The test pads are spaced apart by an average in-line spacing greater than the average in-line spacing between the J-leads 198 at the periphery of the IC carrier. In one embodiment, the test access pads are spaced apart on one-tenth inch centers and the J-leads or other external side terminals of the IC carrier have a spacing of 50 mils center-to-center. The test pads can be connected internally to the leads 198 by various means familiar to those skilled in the art. These internal electrical connections are illustrated schematically at 206. The internal circuit connections can be made with separate electrically conductive pins extending internally from each test pad to a corresponding leads 198 on the IC carrier. Alternatively, such internal circuitry can be brought from one level to another by 3D circuitry techniques in which the circuit traces are routed internally along X, Y and Z axes according to known techniques.

FIG. 27 illustrates use of the IC package 190 with the integrated test pads. In this embodiment, the unit 190 is shown mounted to a printed circuit board 208, with the J-leads 198 individually connected to corresponding contacts on the board. This leaves the array of test pads 204 exposed at the upper surface of the IC package 190. This arrangement allows standard spring probes 210 to access the IC package by contacting the array of test pads 204 to test circuit continuity without any modification to the test head or any other component.

FIGS. 28 through 32 illustrate an alternative form of the invention used for testing integrated circuit devices in which contact between the test module and the leads of the IC device is avoided. Certain IC devices such as the IC packages with the "gull-wing" type leads are interconnected to the leads on a PCB with solder joints which can be sensitive and subject to damage such as fracturing from external pressure contact. The test modules shown in FIGS. 28 through 32 are adapted to test these gull-wing or other similar IC devices without making pressure contact with the leads of the device.

FIG. 28 shows an IC package 212 having mutually spaced apart external leads 214 of a gull-wing configuration along the side edges of the IC package. These leads are connected to conductive leads or circuit traces on a PCB by separate solder joints such as those described above. The gull-wing contacts are electrically connected to separate electrical circuit traces 218 printed on the upper surface of the board. These circuit traces typically fan outwardly on the board away from the gull-wing contacts.

The IC package is tested by a test module 220 having rows of vertically movable pins arranged in a pattern on the test module for making vertical contact with the circuit traces 218 adjacent the gull-wing leads 214, rather than making contact with the leads themselves. The pins on the test module are of composite configuration and include narrow diameter lower portions 222 which are stepped up at an intermediate region to wider-diameter upper portions 224. The lower portions of the pins are carried in a narrow horizontally extending lower plate 226 and the wider-diameter upper portions of the pins are carried in an intermediate level horizontal plate 228 spaced above the lower plate. The plates are both made from an electrically insulating material, preferably phenolic FR-2. The lower and upper portions 222 and 224 of the pins are slidable vertically in corresponding holes extending through the lower and intermediate plates 226 and 228, respectively.

A conductive circuit pattern is carried on an upper surface of the intermediate plate. The circuit pattern is similar to the circuit pattern 76 described previously. The circuit pattern includes an electrically conductive metalized circuit trace pattern of beryllium copper roll-bonded to a plastic insulating film such as Kapton. The film acts as a carrier for the circuit pattern which includes an array of spaced apart test pads 230 on a central region of the circuit pattern. The circuit traces fan outwardly from separate test pads to corresponding elongated electrically conductive fingers 232 which make contact with the tops of the pins as shown best in FIG. 30. The conductive fingers are resilient and act as cantilevered beams. They are held in resilient spring contact with the tops of the pins, and as the pins slide up or down, the fingers continue to make electrical contact with the pins.

The test module further includes a probe plate 234 spaced above the upper pin holding plate 228. The probe plate, intermediate plate and lower plate are fastened together as a unit with spacers 236. Vertical locating pins 238 project downwardly from the lower corners of the module. The central region of the lower plate 226 is open so that the lower plate fits around and provides access for the integrated circuit package 212 during testing. The locating pins 238 are positioned on the module for alignment with corresponding alignment holes 240 in the PCB. The alignment holes 240 are arranged with respect to the circuit traces 218 on the PCB so that when the test module locating pins 238 are aligned in the alignment holes 240, the pins 222 are automatically aligned with and held in contact with corresponding circuit traces on the PCB.

FIG. 28 illustrates one embodiment of the test module prior to positioning the module over the integrated circuit package 212 for testing. FIG. 29 shows the test module in position during testing. In this embodiment, the test module is shown connected to the test unit with hangers 242 secured to a lower probe plate 244 of the test unit. The test probes 246 are shown carried by the support plate 244. In one embodiment of FIG. 28, the hangers 242 hold the test module on the test unit with the test probes in contact with the test pads 230 at the top of the test module. The test module is lowered into position and automatically positioned on the PCB by the locating pins 238 shown in FIG. 29. The hangers 242 are able to slide in corresponding holes 248 in the test unit as the test unit is moved down over the IC package for testing.

The pins are each held in pressure contact with a separate circuit trace on the PCB corresponding to a respective lead on the IC package. The pins are each able to slide vertically independently of the other pins to compensate for different layer thickness of the circuit traces printed on the board.

In an alternative form of the test unit, the test pads 230 can be replaced with a flex cable (not shown) running to the test unit. For testing IC packages with high lead counts (close spacing among leads of say 10 mil centers), the test pads at the top of the module can require close spacing. In certain instances it is useful to avoid test probe contact with the test pads and, instead, to provide a flex cable connection from the circuit pattern on the module to the test unit. The flex cable is, in a sense, thereby hardwired at one end to the test module and at the other end to the test set electronics.

FIGS. 33 through 36 illustrate a further alternate form of the test module which is particularly useful in testing integrated circuit devices in which direct contact between the test module and the leads of the IC device is to be avoided. FIG. 33 shows an IC package 250 which can be of the gull-wing or Quad-Pak variety, in which rows of mutually spaced apart leads 252 project outwardly from the IC package. The leads are individually connected to respective conductive leads or circuit traces 254 on the upper surface of a printed circuit board 255 by separate solder joints. As described previously, the solder joints can be sensitive and subject to damage from fracturing from external pressure contact. The IC package 250 is tested by a test module 256 having separate rows of uniformly spaced apart and parallel spring contacts 258 mounted along each side of a rectangular electrically insulating housing 260. The spring contacts are arranged on the perimeter of the test module housing in patterns adapted for making vertical contact with the rectangular pattern of conductive leads 254 at board level adjacent the leads 252 on the IC package.

The spring contacts 258 on the test module are each in the form of a composite spring biased finger or C-shaped beam having a vertically extending straight lower portion 262, the tip of which makes contact with a corresponding circuit trace 254 at board level during testing. The beams are preferably of one-piece metal construction and are made from a good electrically conductive metal such as beryllium copper. The metal beams are self-supporting in their composite configuration and, in one embodiment, have a uniform thickness of about 0.006 inch. Preferably, the sides of the beams taper narrower outwardly and the lower ends of the beams taper narrower downwardly to form sharp pointed ends for contact with the circuit traces during use.

The straight lower portions of the beams in each row extend downwardly through a long, straight, narrow common slotted opening 264 in the lower portion of the housing.

The slotted opening is located above and in line with the points of contact on the row of conductive circuit traces 254 on the printed circuit board adjacent each side of the IC package. The slotted openings 264 in the underside of the housing are best illustrated in the exploded perspective view of FIG. 34. This figure shows how the electrically insulating housing of the test module is formed by a rectangular top piece 266 and separate long, narrow wall forming side members 268 joined to the base of the top piece 266. The ends of the side members 268 are connected together and also fastened to the top piece by corner pins 269 shown in FIG. 34. Each long, narrow slotted opening 264 extends along the length of side wall member 268 so that when the side members are fastened along the outer perimeter of the rectangular top piece, the long slotted openings 264 can be aligned with the rectangular pattern of conductive circuit traces 254 during use.

Each beam 258 has a C-shaped central portion 270 above the long straight lower portion 262 of the beam. The C-shaped portions of the beams provide a means for deflecting the beams upwardly under spring pressure applied by the tips of the beams to the circuit traces 254 during testing. The lower portions 262 of the beams deflect vertically upwardly during testing. The narrow slotted opening 264 acts as a guide for the deflection of the lower portions of the beams in each row. The beams in each row are not mechanically separated from each other. The exterior surfaces of the beams are preferably coated with an electrical insulating material such as Silastic to avoid electrical shorting between adjacent beams. The C-shaped portions of the beams deflect upwardly into the interior of the module housing during testing, as best illustrated in phantom lines in FIG. 33. A long narrow recess 272 is formed in the underside of the top piece above the C-shaped central portions of the beams in each row. These recessed areas provide spaces into the C-shaped central portions on the springs can deflect during testing, as illustrated best in FIG. 33. It has been found to be advantageous to allow the C-shaped portions of the beams to deflect upwardly into the recessed areas 272 rather than resisting such upward deflection of these portions of the springs.

The wall-forming side members 268 of the housing are preferably J-shaped in cross-sectional configuration, as shown in FIG. 33, by forming a long, narrow recess 274 in the lower portion of each member above the narrower common slotted opening 264. This configuration provides a separate elongated shoulder 276 along the inside of each recess 274. The bottom C-shaped portions 270 of the beams in each row engage these long shoulders to provide a means for pre-loading each spring to the same height and load.

Figure 34:
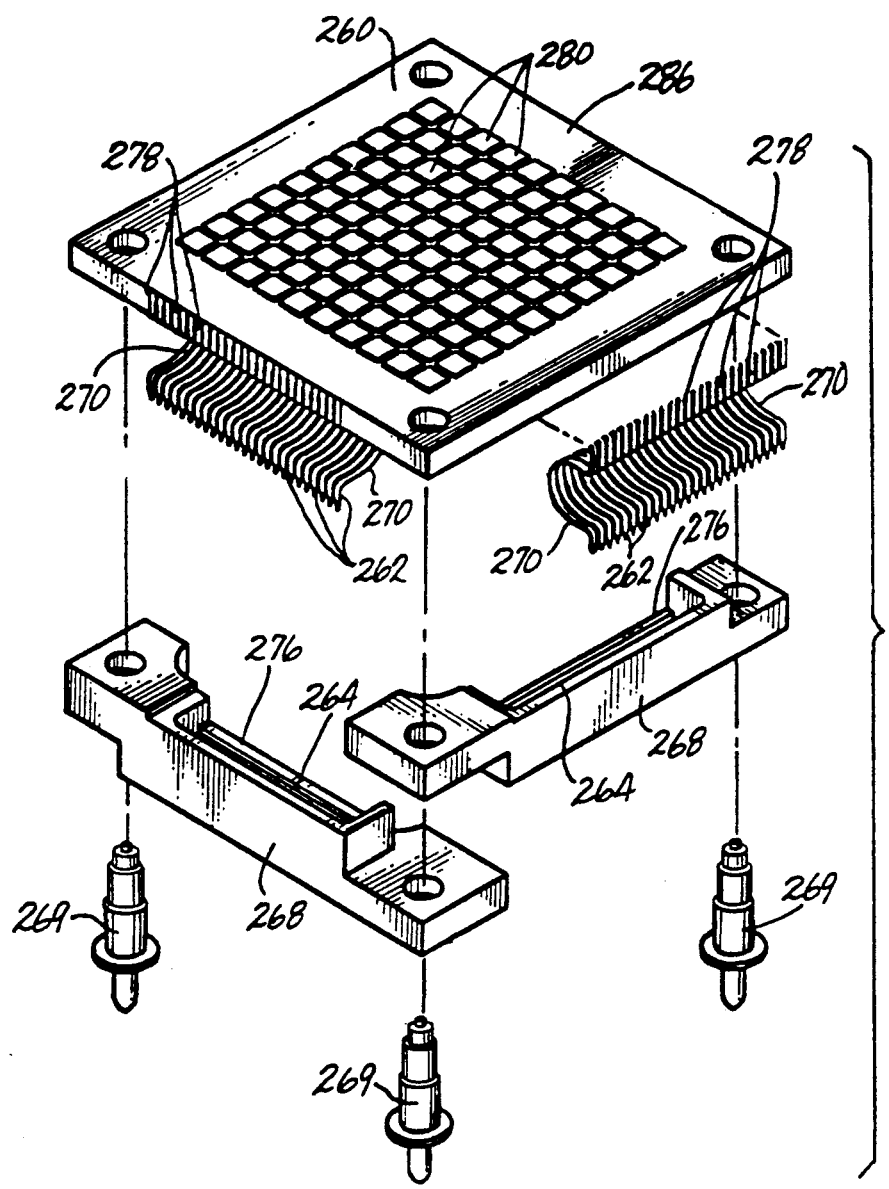
FIG. 34 is an exploded perspective view illustrating components of the embodiment of FIG. 33.

Various techniques can be used for connecting the upper portions of the beams to the circuits on the top piece 260. FIGS. 33 and 34 illustrate one technique in which the beams each comprise a continuous metal piece extending from the straight lower portion 262, along the C-shaped central portion 270, to a right angle reverse bend for forming a U-shaped upper portion 278 which extends around the outer edge of the housing top piece 260. (Upper portions of the beams in FIG. 34 are eliminated for clarity.) The metal piece continues on to form a separate test pad 280 at the end of each beam. These one-piece composite spring contacts have the test pads 280 arranged in an array (as described previously) on the upper face of the test module housing, for translating the narrower in-line spacing of the contact ends of the springs into the wider in-line spacing between the test pads in the two dimensional array. The U-shaped upper portions 278 and test pad portions 280 of the beams can be bonded to the housing top piece 260 by suitable bonding techniques. Moreover, the conductive upper portions 284 of the beams which extend from the corner of the housing to the corresponding test pads 280 can be at different levels within a multi-layer top portion of the module housing. The entire top face of the module can be covered by a suitable plastic insulating film or sheet 286 such as Kapton.

Figure 35:
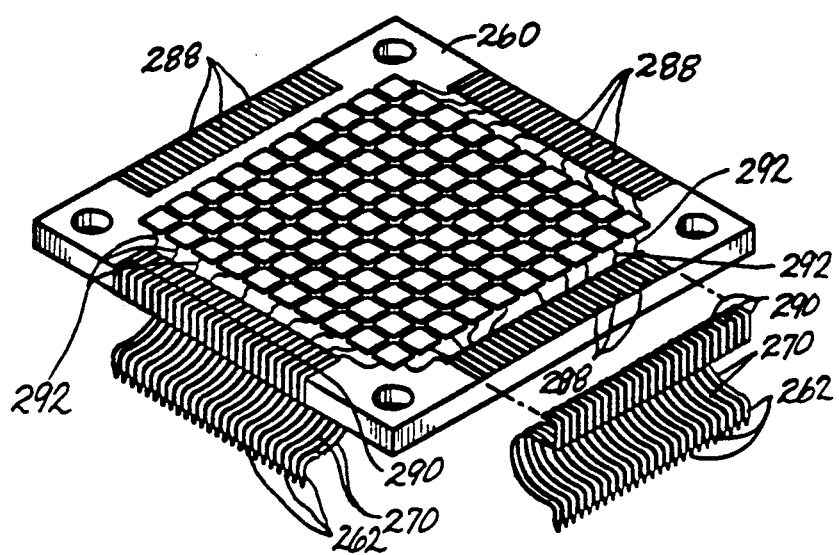
FIG. 35 is a perspective view illustrating an alternative means for connecting the C-shaped beams to the test module test pads.

FIG. 35 illustrates an alternate technique for connecting upper portions of the beams to the contacts on the module housing. In this embodiment, rows of mutually spaced apart narrow conductive pads 288 are formed along the edges of the horizontal top piece 260. Short horizontal contacts 290 integral with the upper portions of the beams are soldered or bonded to the conductive pads 288. During assembly, the bottoms of the beams can be ganged together as a unit, and the upper portions of the beams can be placed over the contact pads as a unit for soldering or bonding. The pads 288 are electrically connected to the array of test pads 280 by corresponding circuit traces 292. These connections can be at different levels in a multi-layer technique for making these connections.

Figure 36:
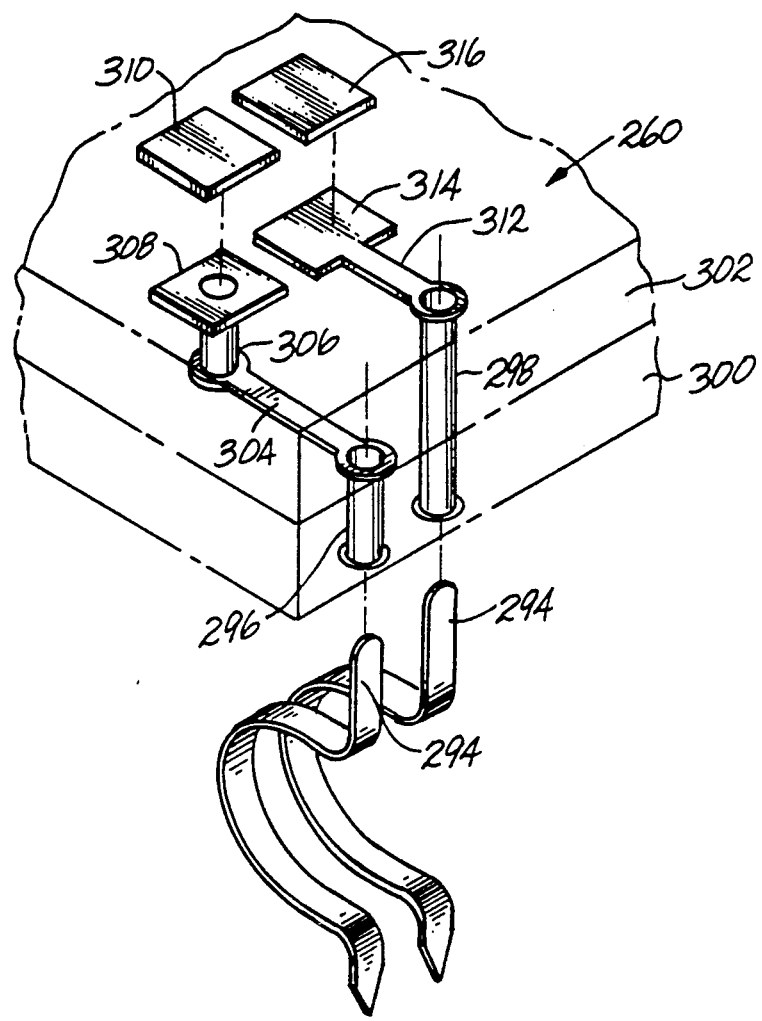
FIG. 36 is an exploded perspective view illustrating a further alternate means for connecting the beams to the test pads of the test module.

FIG. 36 illustrates a further means for connecting upper portions of the beams to the circuits on the module housing. In this embodiment, multi-layer techniques are used for connecting straight upper portions 294 of the beams to the array of test pads at the top surface of the module top piece 260. The straight upper portions 294 of the beams extend upwardly through plated thru-holes 296 and 298 in the top piece. The top piece is illustrated as a multi-layer piece with a lower layer 300 and an upper layer 302. The plated thru-hole 296 extends only through the lower layer 300 and is continuous with a horizontal circuit trace 304 extending across the upper surface of the lower layer 300. The circuit trace 304 terminates at a plated thru-hole 306 which extends upwardly through the upper layer 302 to the upper surface of the upper layer where the thru-hole terminates in the center of a square circuit trace 308 of the same size and shape as the test pads at the top of the module. A solid beryllium copper test pad 310 is soldered or bonded to the top of the square circuit trace 308 to provide one of the teat pads at the upper level of the module housing.

The other plated thru-hole 298 extends through both the lower and upper layers 300 and 302 and terminates at the upper surface of the upper layer at the end of a horizontal circuit trace 312. This circuit trace extends across the top surface of the upper layer 304 and terminates at a square circuit trace pad 314 of the same size and shape as the test pads. A solid beryllium copper square test pad 316 is soldered or bonded to the top of the circuit trace 314. By similar multi-layer techniques, all of the beams of the test module can have the straight upper portions 294 which extend into corresponding conductive thru-holes and are then coupled electrically to the array of test pads at the top surface of the test module by similar multi-layer circuit trace techniques.

During use, the test module 256 is positioned over the IC carrier 250. FIG. 33 shows the test module in position for testing. The test module is shown connected to the test unit with hangers 318 and hanger springs 320 extending downwardly from a lower probe plate 322 of the test unit. Test probes 324, which are preferably spring loaded probes, are shown carried by the probe plate. In the illustrated embodiment, the hangers hold the test module on the test unit and align the test probes for contact with the test pads 280 at the top of the test module. The test module is lowered into position and automatically positioned over the PCB by locating pins 326 at the bottom of at least a pair of the alignment pins 269. The hangers are able to slide in corresponding holes in the test unit as the test unit is moved down over the IC package.

The bottoms of the spring loaded beams are each held in spring biased pressure contact with a separate circuit trace 254 on the PCB corresponding to a respective lead 252 on the IC package. The beams are each able to slide vertically independently of the other beams to compensate for different layer thicknesses of the circuit traces printed on the board. The test module is especially useful for testing IC packages with high lead counts. In one embodiment, the test module is capable of testing a Quad-Pak IC package with leads on the board adjacent the IC package having a 25 mil or 30 mil on-center spacing.

What is claimed is:

1. A translator module for making contact with first and second rows of spaced apart leads on an integrated circuit package mounted among other electrical circuit elements on a loaded printed circuit board, to facilitate circuit verification by a test unit having an array of test probes for use in contacting test points on the board, the translator module comprising;

a housing having top and bottom sides, the housing being adapted for releasable mounting over the integrated circuit package;

first and second rows of spaced apart electrical contacts arranged on the bottom side of the module housing for releasable contact with corresponding leads adjacent the integrated circuit package when the module is mounted over the package;

a plurality of electrically conductive test pads disposed in a substantially common plane on the top side of the module housing and arranged for contact with individual test probes of said test unit; and means for internally electrically connecting said first and second rows of module contacts to corresponding test pads on the module so that contact between the individual leads adjacent the integrated circuit package and corresponding contacts on the module is translated electrically, via the test pads, to individual test probes in the test unit, in which the contacts on the module comprise rows of separate flexible spring-like fingers, and in which the individual spring-like fingers comprise a composite flexible sheet having a metal film contact facing inwardly toward a central region of the module, and a flexible plastic backing sheet for supporting each metal film contact.

2. Apparatus according to claim 1 in which the plastic backing sheet has a memory to provide a spring action to the row of spring-like fingers along the edge of the module.

3. Apparatus according to claim 1, in which the test pads are a metal film bonded to a flexible plastic backing sheet.

4. Apparatus according to claim 3 in which the test pads are bonded to the same plastic backing sheet that supports the individual metal film contacts.

5. Apparatus according to claim 4 in which the module further includes a top plate with spaced apart holes aligned with the test pads for exposing the test pads at the bottom of the holes formed in the top plate.

6. Apparatus according to claim 5 in which the top plate is made of flexible plastic.

7. Apparatus according to claim 6 in which the module further includes a rigidizing member bonded inside the module for supporting the test pads and adding rigidly to the top plate.

8. Apparatus according to claim 1 in which the individual spring-like members comprise a flex-circuit sheet having a flexible plastic backing sheet to which a metalized circuit pattern is bonded, with the test pads being exposed to the top of the module through openings in the backing sheet, and in which the electrical contacts of the module are exposed through the same backing sheet.

9. Apparatus according to claim 8 in which the spring-like fingers are formed by folded-over portions of the backing sheet.

10. An integrated circuit continuity test verification system for making continuity test of circuit elements on a loaded printed circuit board having a plurality of randomly spaced apart integrated circuit packages mounted on an upper surface of the circuit board, in which electrical leads on the integrated circuit packages are spaced apart in rows along oppositely facing side edges of the integrated circuit package, the test system comprising:

a transistor module adapted for releasable contact with a corresponding integrated circuit package, the module comprising a housing having a top side and upright side edges, first and second rows of spaced apart electrical contacts arranged along the side edges of the module housing for releasable engagement with corresponding leads adjacent the integrated circuit package when the module housing is releasably placed over the integrated circuit package, a plurality of electrically conductive test pads in a substantially common plate on the top side of the module housing, and means on the module electrically connecting the test pads to individual ones of said contacts;

a circuit verification test unit coupled to a test fixture having an array of test probes arranged for contact with individual ones of the conductive test pads on the module housing for conducting test signals from the probes to an electrical continuity test analyzer; and actuator means in the test fixture for drawing the test probes into contact with the test pads on the module so that contact between the individual contacts on the module and corresponding leads on the circuit package can be translated electrically, via the contacts on the module, to the individual test probes in the test fixture, in which the contacts on the module comprise rows of separate flexible spring-like fingers, in which the fingers comprise a composite flexible sheet having a metal film contact facing inwardly toward the central region of the module, and a flexible plastic backing sheet for supporting each metal film contact.

11. Electrical continuity test apparatus for making contact with rows of spaced apart leads on an integrated circuit package mounted on a printed circuit board for use in supplying test signals to an electrical continuity test unit, the test apparatus including a translator module comprising a housing adapted to be releasably mounted over said integrated circuit package, the housing having side edges with rows of spaced apart electrical contacts arranged for independent releasable contact with corresponding leads adjacent the integrated circuit package, the contacts being individually compliant spring-like members movable independently of each other for releasable contact under spring tension with corresponding leads on the integrated circuit package, an elongated flexible cable secured to the housing and having separate conductive leads for conducting test signals to said test unit, and electrical circuit means connecting the contacts on the housing to separate corresponding leads on the cable so that when the housing is placed over the integrated circuit package, spring-biased contact between the contacts on the housing and the corresponding leads adjacent the integrated circuit package is translated electrically, via the leads on the cable, to said test unit.

12. Apparatus according to claim 11 in which the individual spring-like members are made from a composite flexible sheet having a metal film contact facing inwardly toward a central region of the module, and a flexible plastic backing sheet for supporting each metal film contact.

13. Apparatus according to claim 12 composite flexible sheet material has a memory so that the contacts provide a row of spring-like members along the edge of the module.

14. Apparatus according to claim 13 in which the flexible cable is a flexible composite sheet in which the conductive leads comprise separate metal film traces bonded to a flexible plastic backing sheet and electrically connected to each metal film contact.

15. Apparatus according to claim 14 in which the flexible composite sheet which comprise a cable is integrally formed with at least a portion of the individual spring like members.

16. A method for testing electrical continuity of circuit elements on a printed circuit board in which one or more of the circuit elements comprise an integrated circuit package having rows of spaced apart electrical leads at least some of which are electrically connected to separate conductive leads on the printed circuit board, the test method comprising:

releasably securing a translator module in a test position over the integrated circuit package, the translator module comprising an housing adapted for mounting over one of said integrated circuit packages, the housing having side edges with rows of spaced apart electrical contacts arranged for releasable contact with corresponding leads adjacent the integrated circuit package, the contacts being individually compliant spring-like members movable independently of each other for releasable contact under spring tension with corresponding leads on the integrated circuit package, an elongated flexible cable secured to the housing and having separate conductive leads for conducting test signals to an electrical circuit continuity test unit, and means electrically connecting the contacts on the housing to separate corresponding leads on the cable, the individual contacts being movable independently to a spring-based position held in releasable contact with the corresponding leads adjacent the integrated circuit package when the module is mounted in said test position, and establishing electrical continuity between the leads on the integrated circuit package and the test unit, when the housing has been placed over the integrated circuit package in said test position, so that contact between the rows of contacts on the housing and corresponding leads adjacent the integrated circuit package is translated electrically, via the leads on the cable, to said test unit for use in verifying electrical connections of the integrated circuit package to circuit elements on the printed circuit board.

17. A method according to claim 16 in which the translator module is placed over each of a plurality of integrated circuit packages manually during such circuit verification testing.

18. A translator module for testing electrical continuity for an integrated circuit package having spaced apart exterior electrical leads connected to corresponding individual circuits on a printed circuit board, to facilitate circuit verification by a remote test unit, the translator module comprising:

a housing adapted for releasable mounted over the integrated circuit package, an upper side of the housing having a fixed upper surface;

first and second rows of spaced apart electrical contacts arranged on a lower side of the module housing for releasable contact with corresponding individual circuits on the printed circuit board adjacent respective leads of the integrated circuit package, the contacts being individually compliant spring-like members movable independently of each other for releasable contact under spring tension with the corresponding circuits on the board adjacent the integrated circuit package;

a plurality of electrical terminals disposed in a fixed pattern on the fixed the upper surface of the housing; and electrical circuit means for internally electrically connecting said first and second rows of contacts on the module to corresponding terminals on the module housing so that contact between the individual circuits on the printed circuit board and the corresponding contacts on the module moves the contacts of the module independently to a spring-biased position held in contact with the individual circuits, in which the terminals on the upper surface of the housing are connected to corresponding terminals of an elongated flexible cable for transmitting test signals to corresponding test circuits in the remote test unit.

* * * * *

UNITED STATES PATENT AND TRADEMARK OFFICE
CERTIFICATE OF CORRECTION

PATENT NO. : 5,247,246  
DATED : September 21, 1993  
INVENTOR(S) : David R. Van Loan; Charles J. Johnston; Mark A. Swart Page 1 of 3

It is certified that error appears in the above-indentified patent and that said Letters Patent is hereby corrected as shown below:

On the Title page item [56] References Cited, U.S. PATENT DOCUMENTS, please insert the following references:

```
-- 3,573,617   4/1971    Randolph et al..324/158F
   4,068,170   1/1978    Chayka et al....324/158F
   4,329,624   5/1982    Luthi et al.....324/158F
   4,506,938   3/1985    Madden..........324/158F
   4,516,072   5/1985    Marpoe, Jr......324/158F
   4,554,505  11/1985    Zachry..........324/158F
   4,560,216  12/1985    Egawa...........324/158F
   4,564,251   1/1986    Hansen et al....324/158F --
```

Column 3, line 12, before "mounted" insert -- be --.  
Column 4, line 43, change "text pads" to  
    -- test pads --.  
Column 6, line 30, before "built-in" insert -- a --.  
Column 11, line 18, before "angle" change "a" to  
    -- an --.  
Column 11, line 64, after "sheeting" insert a period.  
Column 16, line 16, change "text pads" to  
    -- test pads --.

UNITED STATES PATENT AND TRADEMARK OFFICE
CERTIFICATE OF CORRECTION

PATENT NO. : 5,247,246

DATED : September 21, 1993

INVENTOR(S) : David R. Van Loan; Charles J. Johnston; Mark A. Swart

It is certified that error appears in the above-indentified patent and that said Letters Patent is hereby corrected as shown below:

Column 20, line 1, change "over individual" to
-- are placed over the individual --.
Column 20, line 17, after "position" change "owning" to
-- owing --.
Column 20, line 56, before "corresponding" delete "a".
Column 22, line 27, change "thickness" to
-- thicknesses --.
Column 23, line 50, after "springs" insert -- which --.
Column 24, line 59, change "teat" to -- test --.

Column 26, line 23, change "rigidly" to -- rigidity --.
Column 26, line 44, change "transistor" to
-- translator --.
Column 27, line 40, before "composite" insert
-- in which the --.
Column 27, line 50, change "comprise" to
-- comprises --.
Column 27, line 62, before "housing" change "an" to
-- a --.

UNITED STATES PATENT AND TRADEMARK OFFICE
CERTIFICATE OF CORRECTION

PATENT NO. : 5,247,246

DATED : September 21, 1993

INVENTOR(S) : David R. Van Loan; Charles J. Johnston; Mark A. Swart

It is certified that error appears in the above-indentified patent and that said Letters Patent is hereby corrected as shown below:

Column 28, line 11, change "spring-based" to -- spring-biased --.
Column 28, line 37, change "mounted" to -- mounting --.
Column 28, line 51, after "fixed" delete "the".

Signed and Sealed this

Seventh Day of June, 1994

Attest:

BRUCE LEHMAN

Attesting Officer

Commissioner of Patents and Trademarks